United States Patent
Kim

(10) Patent No.: US 10,026,783 B2
(45) Date of Patent: Jul. 17, 2018

(54) LIGHT EMITTING DISPLAY DEVICE

(71) Applicant: Samsung Display Co., Ltd., Yongin-si, Gyeonggi-do (KR)

(72) Inventor: Dong Gyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/950,964

(22) Filed: Nov. 24, 2015

(65) Prior Publication Data

US 2016/0343783 A1    Nov. 24, 2016

(30) Foreign Application Priority Data

Apr. 15, 2015   (KR) ........................ 10-2015-0053237

(51) Int. Cl.
| | | |
|---|---|---|
| *H01L 29/20* | (2006.01) | |
| *H01L 27/32* | (2006.01) | |
| *H01L 51/00* | (2006.01) | |

(52) U.S. Cl.
CPC ...... *H01L 27/3216* (2013.01); *H01L 27/3218* (2013.01); *H01L 51/0011* (2013.01); *H01L 27/322* (2013.01); *H01L 27/3244* (2013.01)

(58) Field of Classification Search
CPC ............. H01L 27/3216; H01L 27/3218; H01L 27/322; H01L 27/3244; H01L 51/0011
See application file for complete search history.

(56) References Cited

U.S. PATENT DOCUMENTS

| | | | | |
|---|---|---|---|---|
| 2006/0138941 | A1* | 6/2006 | Wittmann | ............. H01L 27/322 313/504 |
| 2007/0194707 | A1* | 8/2007 | Choi | ..................... H01L 27/322 313/506 |
| 2007/0200488 | A1* | 8/2007 | Ito | ............................. F21K 2/06 313/500 |

FOREIGN PATENT DOCUMENTS

| | | |
|---|---|---|
| JP | 2012-204164 A | 10/2012 |
| JP | 2012-204165 A | 10/2012 |
| KR | 10-2009-0126060 A | 12/2009 |
| KR | 10-2012-0019016 A | 3/2012 |
| KR | 10-2014-0008962 A | 1/2014 |
| KR | 10-2014-0039599 A | 4/2014 |
| KR | 10-2014-0039607 A | 4/2014 |

* cited by examiner

*Primary Examiner* — Mark Tornow

(74) *Attorney, Agent, or Firm* — Lewis Roca Rothgerber Christie LLP

(57) ABSTRACT

A light emitting display device includes: a first substrate; a plurality of pixels arranged on the first substrate in a matrix and divided into a plurality of unit pixels arranged in a row direction and in a column direction, each of the unit pixels comprising a first pixel and a second pixel are arranged along the row direction, and a third pixel arranged in the column direction with respect to the first pixel and the second pixel; a first electrode corresponding to each of the pixels; a pixel defining layer partitioning the respective pixels on the substrate and having openings exposing the first electrode through the pixel defining layer; first light emitting layers consecutively on the first electrode of the first pixel and the second pixel of the unit pixels arranged in the same row line; second light emitting layers consecutively on the first electrode of the third pixel of the unit pixels arranged in the same row line; and a second electrode on the first light emitting layer and the second light emitting layer.

10 Claims, 20 Drawing Sheets

LIGHT EMITTING DISPLAY DEVICE

CROSS-REFERENCE TO RELATED APPLICATION

This application claims priority to and the benefit of Korean Patent Application No. 10-2015-0053237, filed on Apr. 15, 2015 in the Korean Intellectual Property Office, the disclosure of which is incorporated herein in its entirety by reference.

BACKGROUND

1. Field

Aspects of embodiments of the present invention relate to a light emitting display device.

2. Description of the Prior Art

Among light emitting display devices, an organic light emitting display device is a self-luminous display device which has the characteristics of a relatively wide viewing angle, superior contrast, and high response speed, and thus has been noticed as the next-generation display device.

An organic light emitting display device has a light emitting layer that is made of an organic light emitting material arranged between an anode electrode and a cathode electrode. If anode and cathode voltages are applied to these electrodes, respectively, holes that are injected from the anode electrode move to the light emitting layer through a hole injection layer and a hole transport layer, and electrons move to the light emitting layer through an electron injection layer and an electron transport layer. In the light emitting layer, the electrons and the holes are recombined, and through this recombination, excitons are generated. As the generated excitons are transited from an excited state to a ground state, the light emitting layer emits light to display an image thereon.

The organic light emitting display device may include a pixel defining layer having an opening for exposing the anode electrode that is formed on each of pixels, and a hole injection layer, a hole transport layer, a light emitting layer, an electron transport layer, an electron injection layer, and a cathode electrode are formed on the anode electrode that is exposed through the opening of the pixel defining layer. Among them, the light emitting layer may be formed in various methods, and one of such methods is a deposition method. Recently, as the deposition method, a small mask scanning deposition method, in which a deposition process can be performed in small-scale equipment, has been widely used.

In the case of forming the light emitting layer of the organic light emitting display device using the small mask scanning deposition method, the light emitting layer can be formed by arranging a substrate and a mask that is smaller than the substrate to be spaced apart from each other and depositing an organic light emitting material on the substrate while moving the mask and the substrate relatively to each other.

The above information disclosed in this Background section is only to enhance the understanding of the background of the invention, and therefore it may contain information that does not constitute prior art.

SUMMARY

In the case where the substrate and the mask that is smaller than the substrate are arranged to be spaced apart from each other, the organic light emitting material may be deposited in a direction of an unwanted area of the substrate, for example, adjacent pixels, through a gap space, and thus the light emitting layers may be formed to overlap each other between the adjacent pixels. For example, in the case of the pixels which emit color light that is different from the color light of the adjacent pixels, the light emitting layers that emit substantially different color lights may be formed to overlap each other between the adjacent pixels. Accordingly, in order to reduce overlapping of the light emitting layers that emit different color lights between the adjacent pixels, the organic light emitting display device may be manufactured so that the gap distance between the adjacent pixels becomes larger.

However, as the gap distance between the adjacent pixels that emit different color lights becomes larger, the aperture ratio of the pixels becomes lower.

Accordingly, according to aspects of embodiments of the present invention, a light emitting display device may increase the aperture ratio of pixels through reduction of a gap distance between adjacent pixels that emit different color lights.

Additional aspects, subjects, and features of the present invention will be set forth in part in the description which follows and in part will become apparent to those having ordinary skill in the art upon examination of the following or may be learned from practice of the invention.

According to aspects of some embodiments of the present invention, a light emitting display device includes: a first substrate; a plurality of pixels arranged on the first substrate in a matrix and divided into a plurality of unit pixels arranged in a row direction and in a column direction, each of the unit pixels including a first pixel and a second pixel arranged along the row direction, and a third pixel arranged in the column direction with respect to the first pixel and the second pixel; a first electrode corresponding to each of the pixels; a pixel defining layer partitioning the respective pixels on the first substrate and having openings exposing the first electrode through the pixel defining layer; first light emitting layers consecutively disposed on the first electrode of the first pixel and the second pixel of the unit pixels arranged in the same row line; second light emitting layers consecutively disposed on the first electrode of the third pixel of the unit pixels arranged in the same row line; and a second electrode disposed on the first light emitting layer and the second light emitting layer.

According to some embodiments, the first light emitting layers are disposed on both an upper surface of the pixel defining layer between the first pixel and the second pixel of the unit pixels in the same row line and an upper surface of the pixel defining layer between the unit pixels, and have a stripe shape.

According to some embodiments, the first light emitting layers and the second light emitting layers alternate in the column direction.

According to some embodiments, the first light emitting layers or the second light emitting layers face each other between the adjacent unit pixels in the column direction.

According to some embodiments, the first light emitting layer is a yellow light emitting layer configured to emit yellow light, and the second light emitting layer is a blue light emitting layer configured to emit blue light.

According to some embodiments, the light emitting display device further includes: a second substrate disposed on the second electrode; and a color filter disposed on the second substrate, wherein the color filter includes: a first color filter corresponding to the first pixel and configured to perform filtering of light that is discharged from the first light emitting layer and to emit a first color light in a direction of the second substrate; and a second color filter corresponding to the second pixel and configured to perform filtering of the light that is discharged from the first light emitting layer and to emit a second color light that is different from the first color in the direction of the second substrate.

According to some embodiments, the first color is red, and the second color is green.

According to some embodiments, the color filter further includes a third color filter corresponding to the third pixel and configured to perform filtering of light that is discharged from the second light emitting layer and to emit a light having a color purity that is different from a color purity of the light that is discharged from the second light emitting layer in the direction of the second substrate.

According to some embodiments, the light emitting display device further includes: a second substrate disposed on the second electrode; and a color filter disposed between the first substrate and the first electrode, wherein the color filter includes: a first color filter corresponding to the first pixel and configured to perform filtering of light that is discharged from the first light emitting layer and to emit a first color light in a direction of the first substrate; and a second color filter corresponding to the second pixel and configured to perform filtering of the light that is discharged from the first light emitting layer and to emit a second color light that is different from the first color in the direction of the first substrate.

According to some embodiments, the first pixels or the second pixels face each other between the adjacent unit pixels among the unit pixels arranged in the same row line.

According to some example embodiments of the present invention, a light emitting display device includes: a first substrate; a plurality of pixels arranged on the first substrate in a matrix and divided into a plurality of unit pixels arranged in a row direction and in a column direction, each of the unit pixels including a first pixel and a second pixel arranged along the row direction, and a third pixel arranged in the column direction with respect to the first pixel and the second pixel; a first electrode corresponding to each of the respective pixels and; a pixel defining layer partitioning the respective pixels on the first substrate and having a gap distance between a third opening exposing the first electrode of the third pixel and a second opening exposing the first electrode of the second pixel that is longer than a gap distance between a first opening exposing the first electrode of the first pixel and the second opening; first light emitting layers consecutively disposed on the first electrode of the first pixel and the second pixel of the unit pixels in the same row line; second light emitting layers consecutively disposed on the first electrode of the third pixel of the unit pixels in the same row line; and a second electrode disposed on the first light emitting layer and the second light emitting layer.

According to some embodiments, the first light emitting layers are disposed on both an upper surface of the pixel defining layer between the first pixel and the second pixel of the unit pixels in the same row line and an upper surface of the pixel defining layer between the unit pixels, and have a stripe shape.

According to some embodiments, the first light emitting layers and the second light emitting layers alternate in the column direction.

According to some embodiments, the first light emitting layers or the second light emitting layers face each other between the adjacent unit pixels in the column direction.

According to some embodiments, the first light emitting layer is a yellow light emitting layer configured to emit yellow light, and the second light emitting layer is a blue light emitting layer configured to emit blue light.

According to some embodiments, the light emitting display device further includes: a second substrate disposed on the second electrode; and a color filter disposed on the second substrate, wherein the color filter includes: a first color filter corresponding to the first pixel and configured to perform filtering of light that is discharged from the first light emitting layer and to emit a first color light in a direction of the second substrate; and a second color filter corresponding to the second pixel and configured to perform filtering of the light that is discharged from the first light emitting layer and to emit a second color light that is different from the first color in the direction of the second substrate.

According to some embodiments, the first color is red, and the second color is green.

According to some embodiments, the color filter further includes a third color filter corresponding to the third pixel and configured to perform filtering of light that is discharged from the second light emitting layer and to emit a light having a color purity that is different from a color purity of the light that is discharged from the second light emitting layer in the direction of the second substrate.

According to some embodiments, the light emitting display device further includes: a second substrate disposed on the second electrode; and a color filter disposed between the first substrate and the first electrode, wherein the color filter includes: a first color filter corresponding to the first pixel and configured to perform filtering of light that is discharged from the first light emitting layer and to emit a first color light in a direction of the first substrate; and a second color filter corresponding to the second pixel and configured to perform filtering of the light that is discharged from the first light emitting layer and to emit a second color light that is different from the first color in the direction of the first substrate.

According to some embodiments, the first pixels or the second pixels face each other between the adjacent unit pixels among the unit pixels in the same row line.

According to the light emitting display device according to an embodiment of the present invention, the gap distance between the first pixel and the second pixel that emit different color lights among the unit pixels arranged in the same row line may be reduced, and thus the aperture ratio of the first pixel and the second pixel may be increased.

Accordingly, the whole pixel aperture ratio of the light emitting display device may be increased.

The effects according to the present invention are not limited to the contents as described above, and further various aspects are included in the following description.

BRIEF DESCRIPTION OF THE DRAWINGS

The above and other aspects, features, and characteristics of the present invention will be more apparent from the following detailed description taken in conjunction with the accompanying drawings, in which.

DETAILED DESCRIPTION

Figure 1:
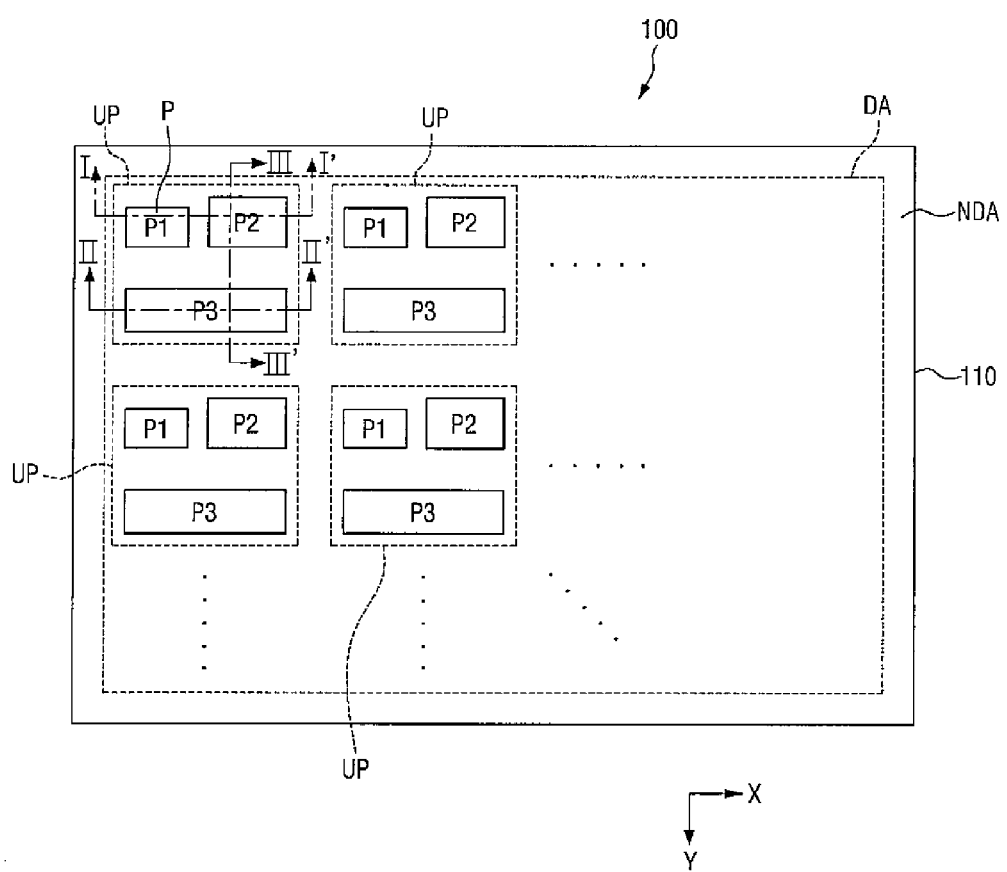
FIG. 1 is a schematic plan view illustrating a pixel arrangement of a light emitting display device according to an example embodiment of the present invention.

Aspects and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be more thorough and more complete and will more fully convey the concept of the invention to those skilled in the art, and the present invention will only be defined by the appended claims, and their equivalents.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Hereinafter, aspects of example embodiments of the present invention will be described with reference to the accompanying drawings.

Figure 2:
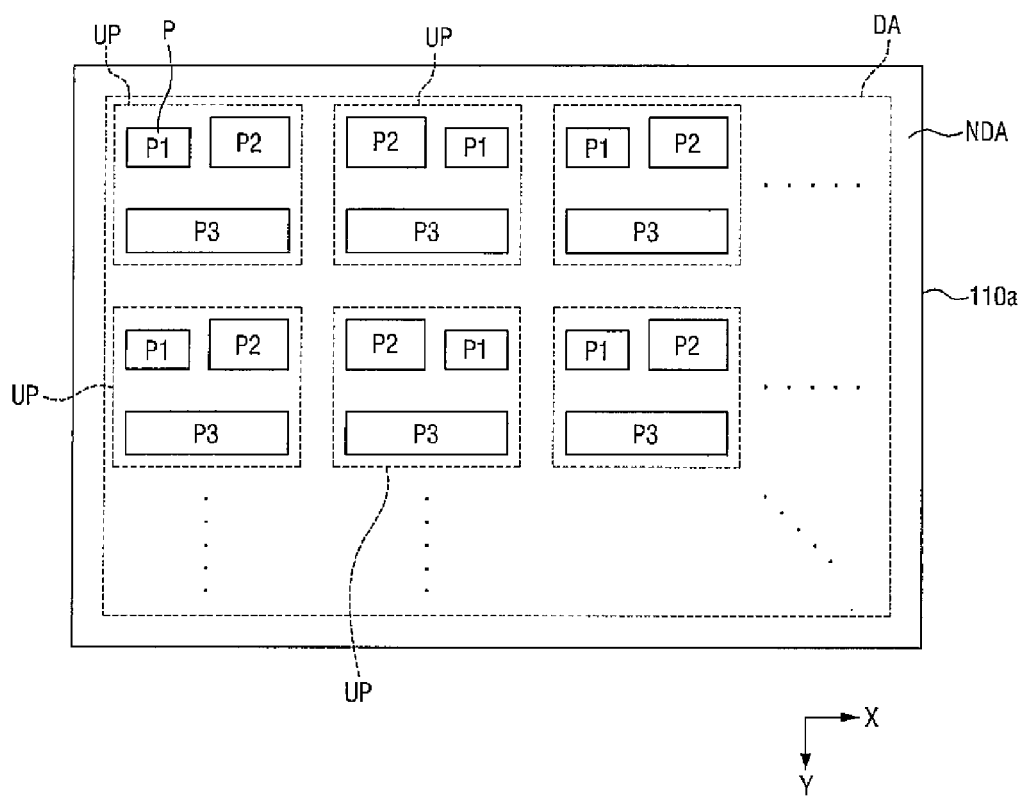
FIG. 2 is a plan view illustrating another example of the pixel arrangement of FIG. 1.
Figure 3:
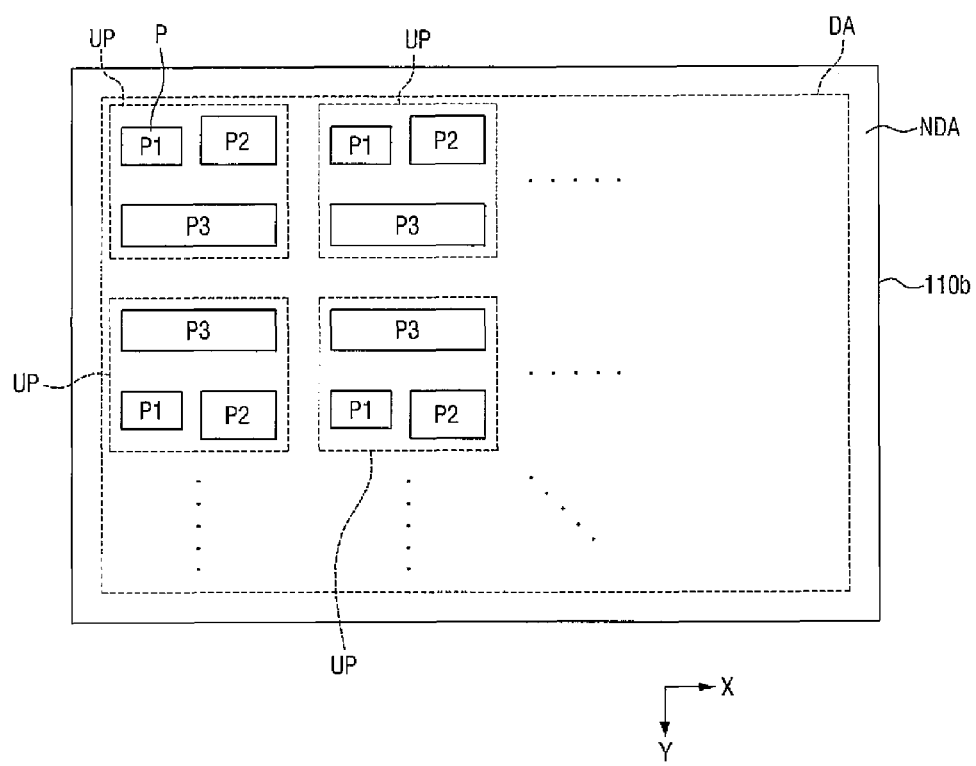
FIG. 3 is a plan view illustrating still another example of the pixel arrangement of FIG. 1.

FIG. 1 is a schematic plan view illustrating a pixel arrangement of a light emitting display device according to an example embodiment of the present invention. FIG. 2 is a plan view illustrating another example of the pixel arrangement of FIG. 1, and FIG. 3 is a plan view illustrating still another example of the pixel arrangement of FIG. 1.

Referring to FIG. 1, a light emitting display device 100 according to an example embodiment of the present invention includes a display area DA that defines a plurality of pixels P, which display an image on a first substrate 110 and are arranged in a matrix form, and a non-display area NDA that is positioned on the outside of the display area DA.

The plurality of pixels P may be divided into a plurality of unit pixels UP arranged in a row direction X and in a column direction Y on the substrate 110. Each of the unit pixels UP includes a first pixel P1 and a second pixel P2 arranged in the row direction X, and a third pixel P3 arranged in the column direction Y with respect to the first pixel P1 and the second pixel P2. The first pixel P1, the second pixel P2, and the third pixel P3 may be pixels that emit different color lights. For example, the first pixel P1 may be a red pixel that emits red light, the second pixel P2 may be a green pixel that emits green light, and the third pixel P3 may be a blue pixel that emits blue light, but the pixels are not limited thereto.

Additionally, the first pixels P1 and the second pixels P2 of the unit pixels UP arranged in the same row line may be arranged in a line, and the third pixels P3 of the unit pixels UP arranged in the same row line may be arranged in a line. Further, in each unit pixel UP, the area of the third pixel P3 may be larger than the area of the first pixel P1 and the area of the second pixel P2, but is not limited thereto. Further, in the unit pixels UP arranged in the same row line, the first pixels P1 and the second pixels P2 may be alternately arranged, but are not limited thereto. For example, as illustrated in FIG. 2, the pixels P, which face each other between the adjacent unit pixels UP among the unit pixels UP arranged in the same row line on the first substrate 110a, may be the first pixels P1 or the second pixels P2. Further, as illustrated in FIG. 3, the pixels P, which face each other between the adjacent unit pixels UP among the unit pixels UP arranged in the column line on the first substrate 110b, may be the same pixels, for example, the third pixels P3.

Next, the structure of the light emitting display device 100 will be described in more detail. Hereinafter, example structures of the first pixel P1 portion, the second pixel P2 portion, and the third pixel P3 portion of the unit pixel UP will be described with respect to the light emitting display device 100.

Figure 4:
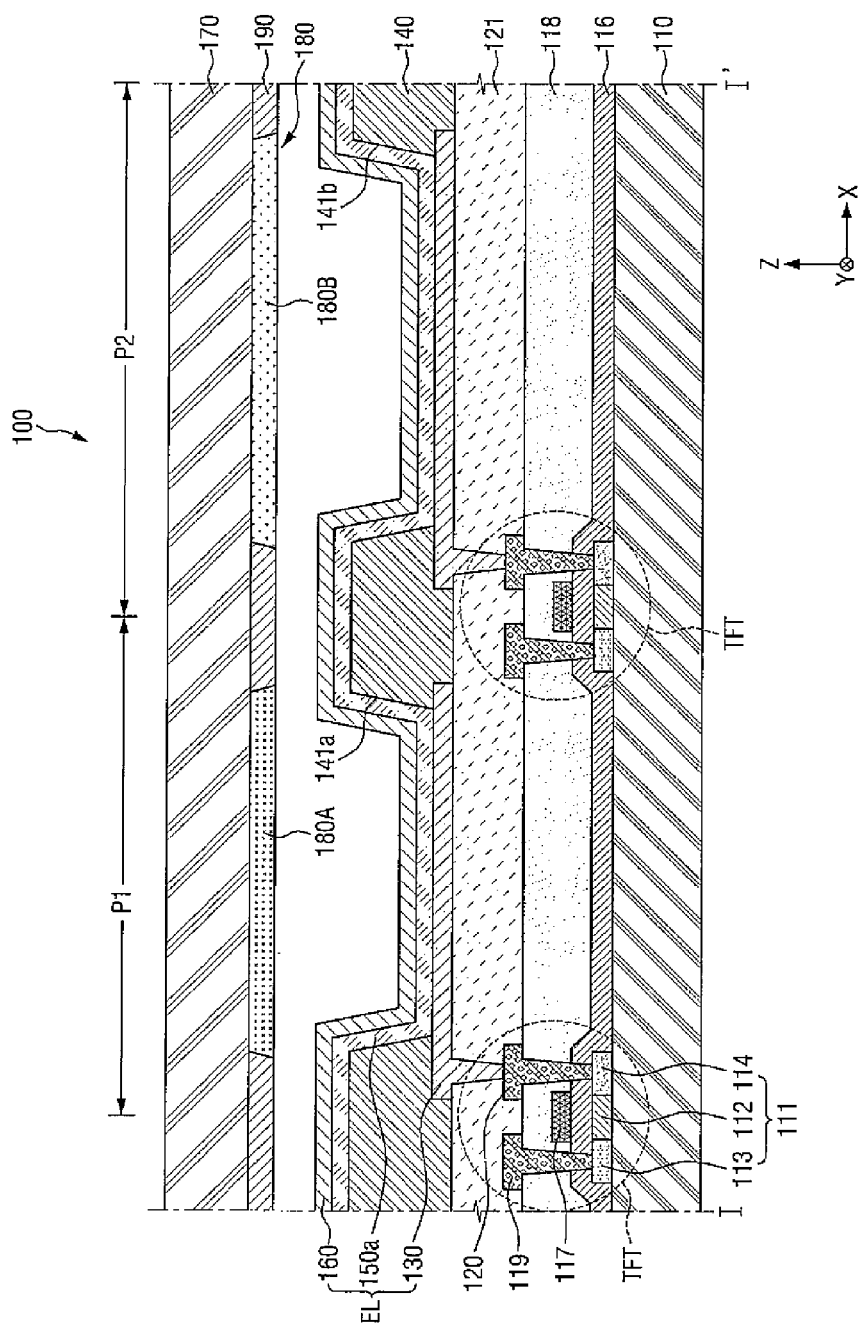
FIG. 4 is a cross-sectional view of a portion that is taken along the line I-I' FIG. 1.
Figure 5:
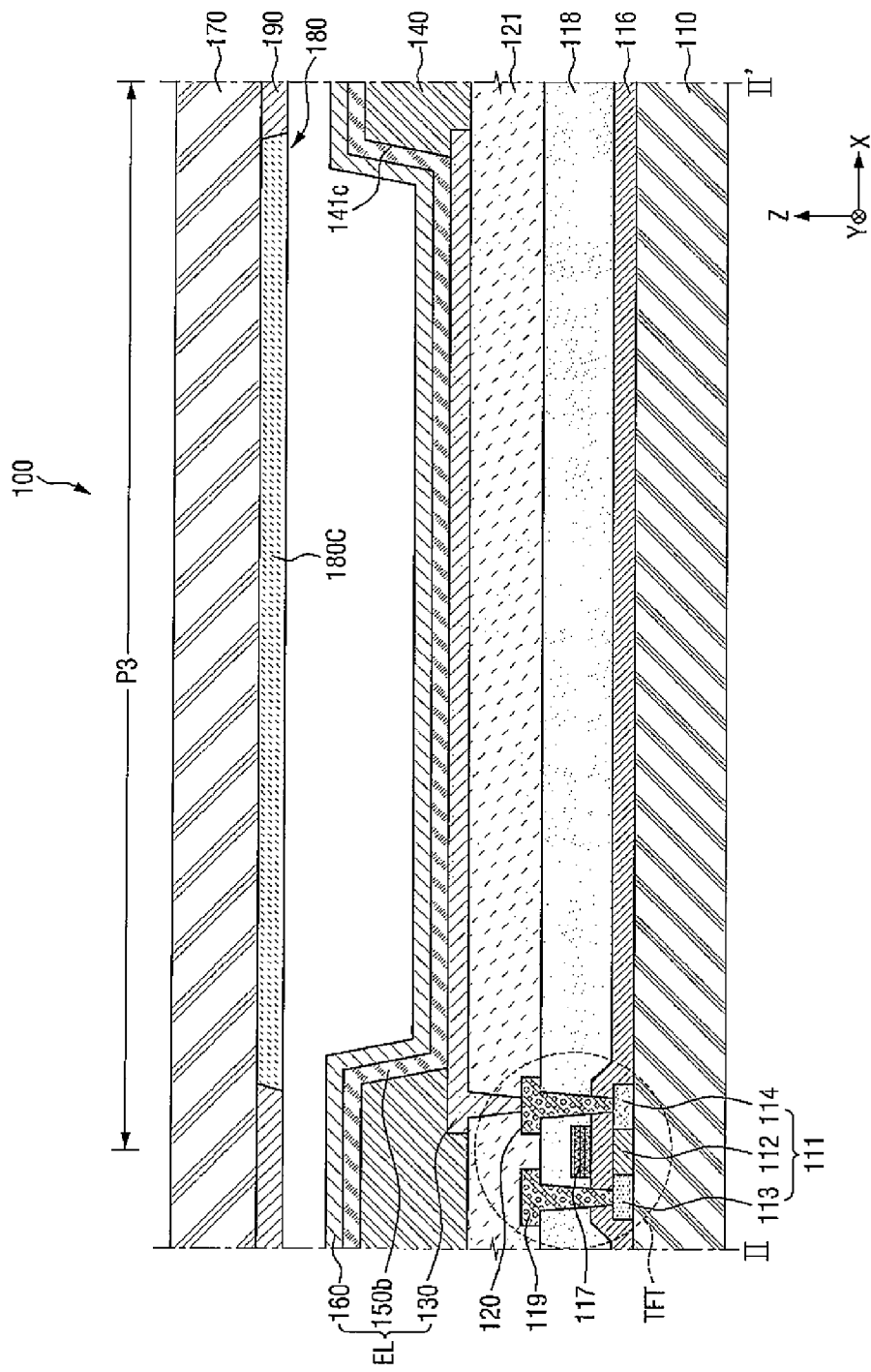
FIG. 5 is a cross-sectional view of a portion that is taken along the line II-II' of FIG. 1.
Figure 6:
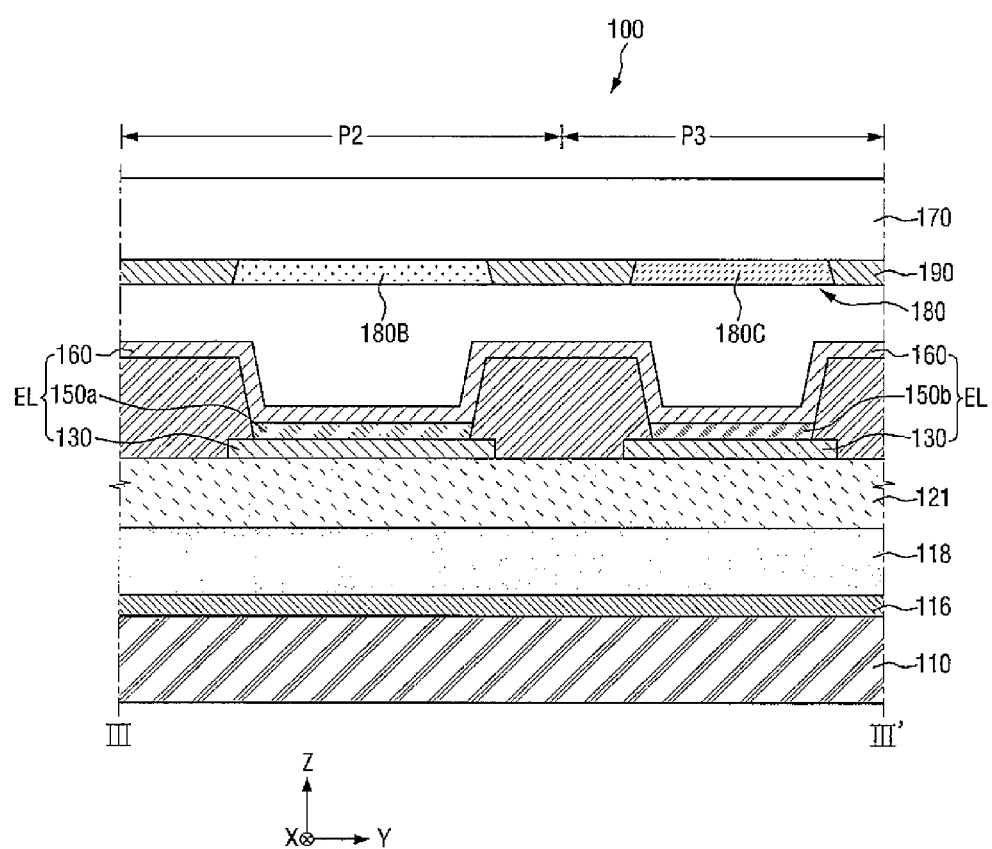
FIG. 6 is a cross-sectional view of a portion that is taken along the line III-III' of FIG. 1.
Figure 7:
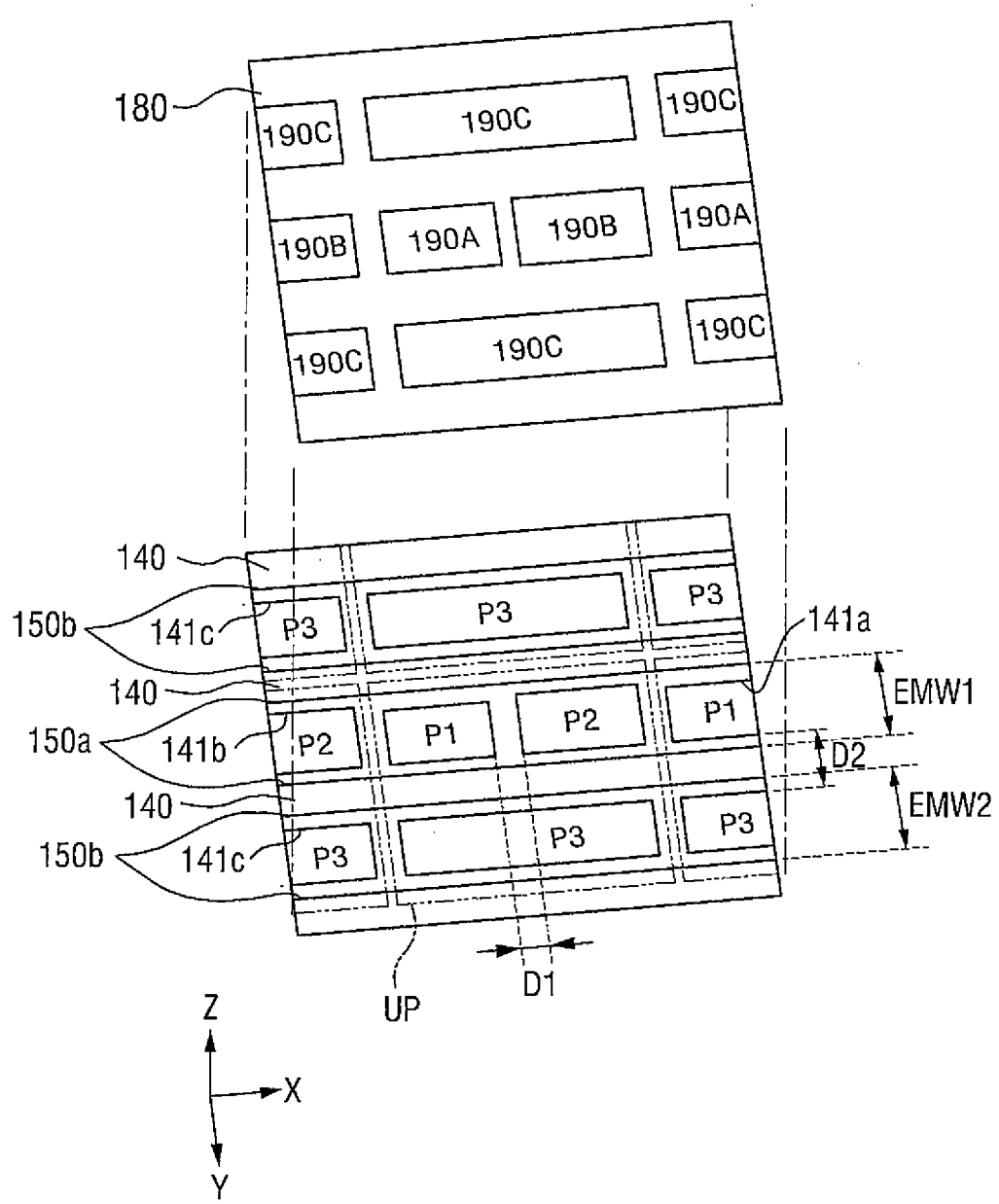
FIG. 7 is a schematic perspective view illustrating the corresponding relationship between a pattern of an organic light emitting layer and a color filter of FIGS. 4 and 5.

FIG. 4 is a cross-sectional view of a portion that is taken along the line I-I' FIG. 1, FIG. 5 is a cross-sectional view of a portion that is taken along the line II-II' of FIG. 1, and FIG. 6 is a cross-sectional view of a portion that is taken along the line III-III' of FIG. 1. FIG. 7 is a schematic perspective view illustrating the corresponding relationship between a pattern of an organic light emitting layer and a color filter of FIGS. 4 and 5.

Referring to FIGS. 4 and 5, the light emitting display device 100 may include a substrate 110, an active layer 111, a gate insulating layer 116, a gate electrode 117, an interlayer insulating layer 118, a source electrode 119, a drain electrode 120, a planarization layer 121, a first electrode 130, a pixel defining layer 140, a first light emitting layer 150a, a second light emitting layer 150b, a second electrode 160, a second substrate 170, a color filter 180, and a black matrix 190. The respective members may be laminated in a Z direction as illustrated in FIGS. 4, 5, and 6. The light emitting display device 100 may be implemented by a top emission light emitting display device, in which light generated from the first light emitting layer 150a and the second light emitting layer 150b is emitted to the top of the first substrate 110, i.e., in the direction of the second substrate 170.

The first substrate 110 may be a transparent insulating substrate. The insulating substrate may be made of a material, such as glass, quartz, or polymer resin. Examples of the polymer material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (Pi), polycarbonate (PC), cellulose triacetate (CAT or TAC), cellulose acetate propionate (CAP), and a combination thereof. In some embodiments, the insulating substrate may be a flexible substrate that is made of a flexible material, such as polyimde (PI).

The first substrate 110 includes a plurality of pixels P (e.g., as shown in FIG. 1) that are arranged in a matrix form. Because the arrangement of the plurality of pixels P (e.g., as shown in FIG. 1) has been described in detail, the duplicate explanation thereof will be omitted.

The active layer 111 may be arranged on the first substrate 110, and may include a channel area 112, a source area 113 and a drain area 114 that are positioned on both sides of the channel area 112. The active layer 111 may be formed of silicon, for example, amorphous silicon or polysilicon, and the source area 113 and the drain area 114 may be doped with p-type or n-type impurities. The active layer 111 may be formed through a photolithography method, but is not limited thereto.

The gate insulating layer 116 is formed on the first substrate 110 to cover the active layer 111. The gate insulating layer 116 electrically insulates the gate electrode 117 and the active layer 111 from each other. The gate insulating layer 116 may be made of an insulating material, for example, silicon oxide (SiOx), silicon nitride (SiNx), or metal oxide. The gate insulating layer 116 may be formed through a deposition method, but is not limited thereto.

The gate electrode 117 may be formed on the gate insulating layer 116. The gate electrode 117 may be formed in a position that overlaps the channel area 112 on the gate insulating layer 116. The gate electrode 117 may include metal, alloys, metal nitride, conductive metal oxide, or transparent conductive materials. The gate electrode 117 may be formed through a photolithography method, but is not limited thereto.

The interlayer insulating layer 118 may be formed on the gate insulating layer 116 to cover the gate electrode 117. The interlayer insulating layer 118 may be made of silicon compounds. For example, the interlayer insulating layer 118 may include silicon oxide, silicon nitride, silicon oxynitride, silicon carbonitride, or silicon oxycarbonate. The interlayer insulating layer 118 may serve to insulate the gate electrode 117 from the source electrode 119 and the drain electrode 120. The interlayer insulating layer 118 may be formed through a deposition method, but is not limited thereto.

The source electrode 119 and the drain electrode 120 may be formed on the interlayer insulating layer 118. The source electrode 119 penetrates the interlayer insulating layer 118 and the gate insulating layer 116 to be connected to the source area 113 of the active layer 111, and the drain electrode 120 penetrates the interlayer insulating layer 118 and the gate insulating layer 116 to be connected to the drain area 114.

The source electrode 119 and the drain electrode 120 may include metal, alloys metal nitride, conductive metal oxide, or transparent conductive materials. For example, the source electrode 119 and the drain electrode 120 may be made of aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, and/or indium zinc oxide. The source electrode 119 and the drain electrode 120 may be formed through a photolithography method, but is not limited thereto.

The source electrode 119 and the drain electrode 120 form a thin film transistor TFT together with the active layer 111 and the gate electrode 117. The thin film transistor TFT may be a driving transistor which supplies current that corresponds to a voltage that is applied to the gate electrode 117 to a light emitting element EL. The thin film transistor TFT may be connected to a switching transistor. The switching transistor applies a voltage which corresponds to a data signal that is supplied through a data line to the thin film transistor TFT in response to a gate signal that is supplied through a gate line.

The planarization layer 121 may be formed on the interlayer insulating layer 118 to cover the source electrode 119 and the drain electrode 120. The planarization layer 121 may have a flat surface. The planarization layer 121 may be made of an insulating material. In some embodiments, the planarization layer 121 may be made of an organic material, for example, polyimide. The planarization layer 121 may be formed through a deposition method, but is not limited thereto.

The first electrode 130 is formed on the first substrate 110 for each pixel P (e.g., as shown in FIG. 1). The first electrode 130 may be an anode electrode which receives a signal that is applied to the drain electrode 120 of the thin film transistor TFT and provides holes to the first light emitting layer 150a or the second light emitting layer 150b, or may be a cathode electrode which provides electrons thereto. The first electrode 130 may be used as a transparent electrode or a reflective electrode. In the case where the first electrode 130 is used as a transparent electrode, it may be formed of ITO (Indium Tin Oxide), IZO (Indium Zinc Oxide), ZnO (Zinc Oxide), and/or $In_2O_3$. Further, in the case where the first electrode 130 is used as a reflective electrode, it may be formed by forming a reflective layer that is made of Ag, Mg, Al, Pt, Pd, Au, Ni, Nd, Ir, Cr, and/or a compound thereof and then forming ITO, IZO, ZnO, or $In_2O_3$ thereon. The first electrode 130 may be formed through a photolithography process, but is not limited thereto.

The pixel defining layer 140 partitions respective pixels P (e.g., as shown in FIG. 1) on the first substrate 110, and has openings 141a, 141b, and 141c for exposing the first electrode 130. Accordingly, the pixel defining layer 140 enables the first light emitting layer 150a or the second light emitting layer 150b to be formed on the first electrode 130 through the openings 141a, 141b, and 141c.

The openings 141a, 141b, and 141c may be the first opening 141a for exposing the first electrode 130 of the first pixel P1, the second opening 141b for exposing the first electrode 130 of the second pixel P2, and the third opening 141c for exposing the first electrode 130 of the third pixel P3. The area of the third opening 141c may be larger than the area of the first opening 141a and the area of the second opening 141b, but is not limited thereto.

However, in the case where the area of the third opening 141c is larger than the area of the first opening 141a and the area of the second opening 141b, the light emitting efficiency of the second light emitting layer 150b, which is arranged on the first electrode 130 that is exposed through the third opening 141c, may be lower than the light emitting efficiency of the first light emitting layer 150a, which is arranged on the first electrode 130 that is exposed through the first opening 141a and on the first electrode 130 that is exposed through the second opening 141b. Accordingly, the area of the third pixel P3 that includes the second light emitting layer 150b having low light emitting efficiency becomes increased, and the areas of the first pixel P1 and the second pixel P2 that include the first light emitting layer 150a having high light emitting efficiency become decreased, so that the light emitting efficiency of the unit pixel UP can be entirely improved.

Further, the gap distance D2 between the second opening 141b and the third opening 141c, in which the second light emitting layer 150b is arranged, may be longer than the gap distance D1 between the first opening 141a and the second opening 141b. Accordingly, in the case where the first light emitting layer 150a and the second light emitting layer 150b that emit different color lights are formed through a small mask scanning (SMS) deposition method or the like, the first light emitting layer 150a and the second light emitting layer 150b may be prevented from unwantedly overlapping each other.

The pixel defining layer 140 may be made of an insulating material. Specifically, the pixel defining layer 140 may be formed to include at least one organic material selected from the group including benzocyclobutene (BCB), polyimide (PI), polyamide (PA), acryl resin, and phenol resin. In some embodiments, the pixel defining layer 140 may be formed to include an inorganic material, such as silicon nitride. The pixel defining layer 140 may be formed through a photolithography process, but is not limited thereto.

The first light emitting layer 150a is consecutively formed on the first electrodes 130 of the first pixels P1 and the second pixels P2 of the unit pixels UP arranged in the same row line. That is, the first light emitting layer 150a may be arranged not only between the first pixel P1 and the second pixel P2 in one unit pixel UP but also between the adjacent unit pixels UP, and may be in a stripe shape. The first light emitting layer 150a is arranged on both an upper surface of the pixel defining layer 140 between the first pixel P1 and the second pixel P2 in the unit pixel UP and an upper surface of the pixel defining layer 140 between the adjacent unit pixels UP. In this case, the first light emitting layer 150a may have a first width EMW1.

The first light emitting layer 150a may be a yellow light emitting layer that emits yellow light. That is, the first light emitting layer 150a may emit yellow light through recombination of holes provided from the first electrode 130 and electrons provided from the second electrode 160. For example, if the holes and the electrons are provided to the first light emitting layer 150a, they are recombined to form excitons, and as the excitons are transited from an excited state to a ground state, the yellow light emitting layer emits yellow light. The yellow light emitting layer may be formed of a low-molecular or high-molecular organic material. In some embodiments, the yellow light emitting layer may include rubrene or $IrC_{39}H_{29}N_3$, but is not limited thereto. The first light emitting layer 150a may be formed through a small mask scanning (SMS) deposition method, but is not limited thereto.

The second light emitting layer 150b is consecutively formed on the first electrodes 130 of the third pixels P3 of the unit pixels UP arranged in the same row line. That is, the second light emitting layer 150b may be arranged between the adjacent unit pixels UP, and may be in a stripe shape. In this case, the second light emitting layer 150b is arranged on an upper surface of the pixel defining layer 140 between the adjacent unit pixels UP. The second light emitting layer 150b may have a second width EMW2. The second width EMW2 may be larger than the first width EMW1 of the first light emitting layer 150a, but is not limited thereto.

The second light emitting layer 150b may be a blue light emitting layer that emits blue light. That is, the second light emitting layer 150b may emit blue light through recombination of holes provided from the first electrode 130 and electrons provided from the second electrode 160. For example, if the holes and the electrons are provided to the second light emitting layer 150b, they are recombined to form excitons, and as the excitons are transited from an excited state to a ground state, the blue light emitting layer emits blue light. The blue light emitting layer may be formed of a low-molecular or high-molecular organic material. In some embodiments, the blue light emitting layer may include distryl compounds, but is not limited thereto. The second light emitting layer 150b may be formed through a small mask scanning (SMS) deposition method, but is not limited thereto.

FIG. 7 illustrates that the first light emitting layer 150a and the second light emitting layer 150b are alternately arranged in the column direction Y, but are not limited thereto. For example, light emitting layers that face each other between the adjacent unit pixels UP arranged in the column direction Y may be the first light emitting layers 150a or the second light emitting layers 150b.

Additionally, a hole injection layer and a hole transport layer may be interposed between the first electrode 130 and the first light emitting layer 150a and between the first electrode 130 and the second light emitting layer 150b. Further, an electron transport layer and an electron injection layer may be interposed between the first light emitting layer 150a and the second electrode 160 and between the second light emitting layer 150b and the second electrode 160. In the case where the first electrode 130 is a cathode electrode and the second electrode 160 is an anode electrode, the electron injection layer and the electron transport layer may be interposed between the first electrode 130 and the first light emitting layer 150a and between the first electrode 130 and the second light emitting layer 150b, and the hole transport layer and the hole injection layer may be interposed between the first light emitting layer 150a and the second electrode 160 and between the second light emitting layer 150b and the second electrode 160.

The second electrode 160 may be formed on the first light emitting layer 150a and the second light emitting layer 150b, and may be a cathode electrode that provides electrons to the first light emitting layer 150a and the second light emitting layer 150b or an anode electrode that provides holes thereto. In the same manner as the first electrode 110, the second electrode 160 may be used as a transparent electrode or a reflective electrode. In the case where the light emitting display device 100 is implemented by a top emission light emitting display device, the second electrode 160 may be used as a transparent electrode. The second electrode 160 may be formed through a deposition process, but is not limited thereto.

The second substrate 170 may face the second electrode 160, and may be coupled to the first substrate at an interval through a sealant. Accordingly, the second substrate 170 can protect a structure on the first substrate 100 from the outside. Like the first substrate 110, the second substrate 170 may be a transparent insulating substrate. In some embodiments, the second substrate 170 may be an encapsulation layer that covers the whole structure. The encapsulation layer may include an insulating material.

The color filter 180 is formed for each pixel P (e.g., as shown in FIG. 1) on the second substrate 170. The color filter 180 may include a first color filter 180A, a second color filter 180B, and a third color filter 180C.

The first color filter 180A may be formed on an area that overlaps the first opening 141a on the first pixel P1 with an area that is larger than the area of the first opening 141a. The first color filter 180A may be a filter which filters the light that is emitted from the first light emitting layer 150a of the first pixel P1, for example, yellow light, and emits a first color light, for example, red light, in the direction of the second substrate 170.

The second color filter 180B may be formed on an area that overlaps the second opening 141b on the second pixel P2 with an area that is larger than the area of the second opening 141b. The second color filter 180B may be a filter which filters the light that is emitted from the first light emitting layer 150a of the second pixel P2, for example, yellow light, and emits a second color light, for example, green light, in the direction of the second substrate 170.

The third color filter 180C may be formed on an area that overlaps the third opening 141c on the third pixel P3 with an area that is larger than the area of the third opening 141c. The third color filter 180C may be a filter which filters the light that is emitted from the second light emitting layer 150b of the third filter P3, for example, blue light, and emits a light having a color purity that is different from the color purity of the light that is emitted from the second light emitting layer 150b in the direction of the second substrate 170. In some embodiments, in the case where the light that is emitted from the second light emitting layer 150b is a sky blue light having low color purity, the third color filter 180C may be a filter which filters the sky blue light and emits deep blue light having high color purity in the direction of the second substrate 170 to implement clear color.

The first color filter 180A, the second color filter 180B, and the third color filter 180C as described above may emit three different color lights from the first light emitting layer 150a and the second light emitting layer 150b, which are formed on the unit pixels UP arranged in the same row line and emit two different color lights, in the direction of the second substrate 170. This is, because even if the first pixel P1 and the second pixel P2 in each unit pixel UP commonly include the first light emitting layer 150a, the first color filter 180A and the second color filter 180B can filter one color light that is emitted from the first light emitting layers 150a of the first pixel P1 and the second pixel P2 and emit two different color lights in the direction of the second substrate 170.

The first light emitting layers 150a, which are commonly included in the first pixel P1 and the second pixel P2 in each unit pixel UP, may be consecutively formed on the first electrodes 130 of the first pixels P1 and the second pixels P2 of the unit pixels UP arranged in the same row line using a small mask scanning (SMS) deposition method. That is, the first light emitting layers 150a that emit the same color light may be consecutively formed on the first electrode 130 of the first pixel P1 and the first electrode 130 of the second pixel P2.

Accordingly, the gap distance D1 between the first opening 141a of the pixel defining layer 140 that exposes the first electrode 130 of the first pixel P1 and the second opening 141b of the pixel defining layer 140 that exposes the first electrode 130 of the second pixel P2 in the unit pixels UP arranged in the same row line can be reduced to be shorter than the gap distance that is required between the first opening of the pixel defining layer that exposes the first electrode of the first pixel and the second opening of the pixel defining layer that exposes the first electrode of the second pixel to prevent the light emitting layers from being formed to overlap each other in the case of forming the light emitting layers that emit the different color lights on the first electrode of the first pixel and on the first electrode of the second pixel using the small mask scanning (SMS) method.

Accordingly, in the light emitting display device 100 which includes the first light emitting layers 150a that are consecutively formed on the first electrodes 130 of the first pixels P1 and the second pixels P2 of the unit pixels UP arranged in the same row line using the small mask scanning (SMS) deposition method, and the second light emitting display layers 150b that are consecutively formed on the first electrodes 130 of the third pixels P3 of the unit pixels UP arranged in the same row line, the gap distance between the first pixel P1 and the second pixel P2 that emit different color lights among the unit pixels UP arranged in the same row line can be reduced, and thus the aperture ratio of the first pixel P1 and the second pixel P2 can be increased.

The black matrix 190 may be arranged on the second substrate 170. The black matrix 190 may be arranged at the same level as the level of the color filter 180 on the second substrate 170, and may be arranged in areas except for the areas in which the first color filter 180A, the second color filter 180B, and the third color filter 180C are formed on the second substrate 170. The black matrix 190 is formed of a light blocking material to block color mixing that may appear among the first color filter 180A, the second color filter 180B, and the third color filter 180C.

As described above, because the light emitting display device 100 according to an embodiment of the present invention includes the first light emitting layers 150a which are consecutively formed on the first electrodes 130 of the first pixels P1 and the second pixels P2 that emit different colors in the unit pixels UP arranged in the same row line, the first color filters 180A which convert the light emitted from the first light emitting layer 150a of the first pixel P1 into the first color light to emit the first color light, and the second color filters 180B which convert the light emitted from the first light emitting layer 150a of the second pixel P2 into the second color light to emit the second color light, the gap distance between the first pixel P1 and the second pixel P2 that emit different color lights among the unit pixels UP arranged in the same row line can be reduced, and thus the aperture ratio of the first pixel P1 and the second pixel P2 can be increased.

Accordingly, the whole pixel aperture ratio of the light emitting display device 100 can be increased.

Next, a method for manufacturing a light emitting display device 100 according to an embodiment of the present invention will be described. Hereinafter, the unit pixels UP (e.g., as shown in FIG. 1) are illustrated in explaining the method for manufacturing a light emitting display device 100.

FIGS. 8 to 18 are cross-sectional views and a perspective view explaining a method for manufacturing a light emitting display device according to an embodiment of the present invention.

Figure 8:
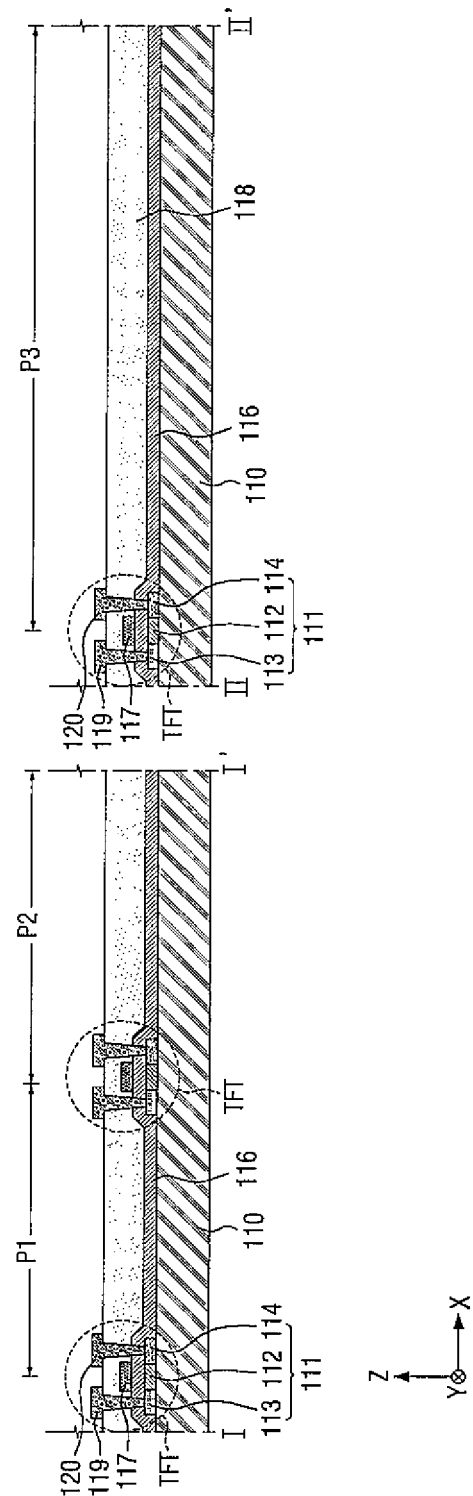
FIGS. 8 to 18 are cross-sectional views and a perspective view explaining a method for manufacturing a light emitting display device according to an example embodiment of the present invention.

Referring to FIG. 8, a first substrate 110 that includes thin film transistors TFT is prepared. The first substrate 110 includes a plurality of pixels P (e.g., as shown in FIG. 1) arranged in a matrix form. Because the arrangement of the plurality of pixels P (e.g., as shown in FIG. 1) has been described, the duplicate explanation thereof will be omitted. The thin film transistor TFT may be arranged on the first substrate 110 in each of pixels P (e.g., as shown in FIG. 1), for example, in each of a first pixel P1, a second pixel P2, and a third pixel P3.

Figure 9:
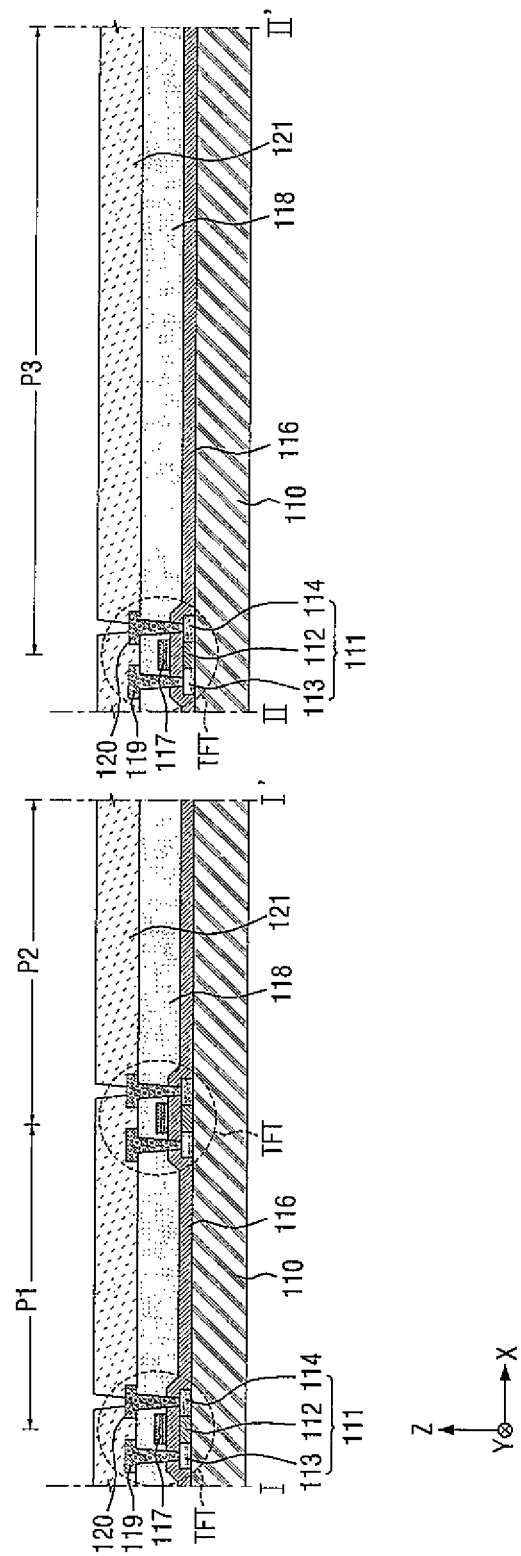

Then, referring to FIG. 9, a planarization layer 121 is formed on the first substrate 110. Specifically, the planarization layer 121 may be formed on an interlayer insulating layer 118 to cover a source electrode 119 and a drain electrode 120 of the thin film transistor TFT. In this case, an opening for exposing the drain electrode 120 may be formed on a portion of the planarization layer 121 that overlaps the drain electrode 120. The planarization layer 121 may be formed by depositing an insulating material on the source electrode 119 and the drain electrode 120 and patterning the deposited insulating material.

Figure 10:
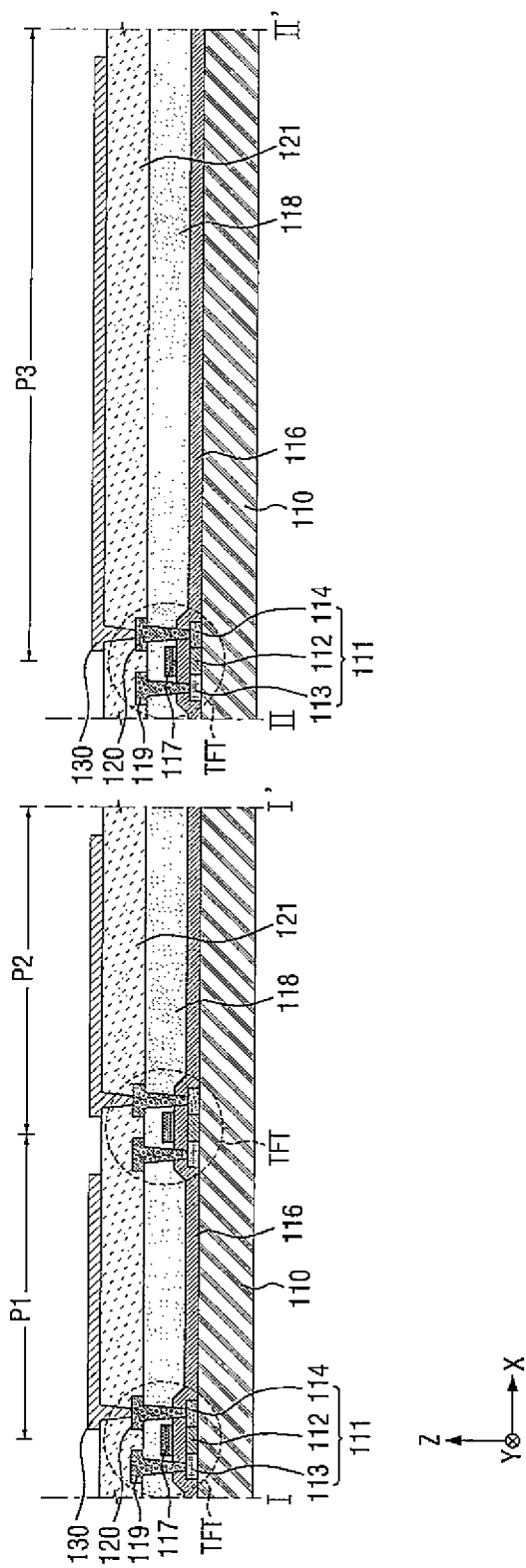

Then, referring to FIG. 10, a first electrode 130 is formed on the first substrate 110 for each of the pixels P (e.g., as shown in FIG. 1). For example, the first electrode 130 may be formed on the first pixel P1, the second pixel P2, and the third pixel P3 by depositing a transparent electrode material or a reflective material, for example, the reflective material, on the planarization layer 121 and patterning the deposited reflective material. In this case, the first electrode 130 may be formed to be connected to the drain electrode 120 of the thin film transistor TFT for each of the first pixel P1, the second pixel P2, and the third pixel P3.

Figure 11:
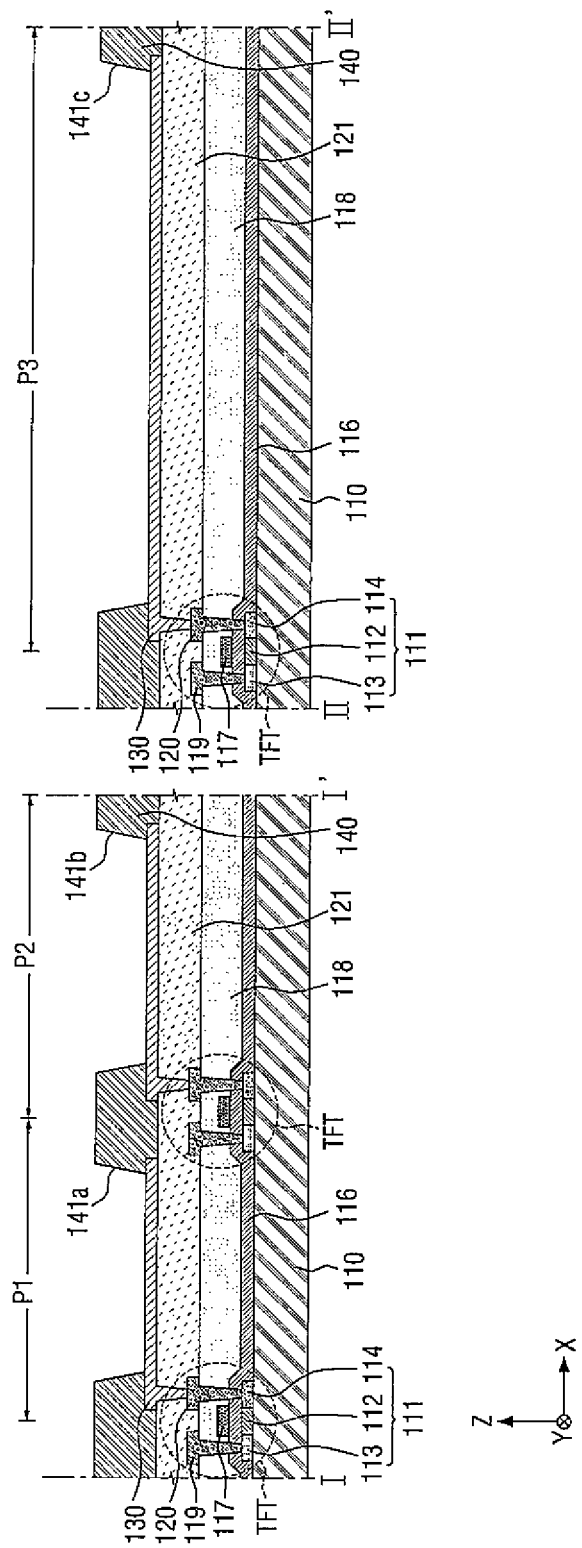

Then, referring to FIG. 11, a pixel defining layer 140, which partitions the respective pixels P (e.g., as shown in FIG. 1) on the first substrate 110 and has openings 141a, 141b, and 141c for exposing the first electrode 130 on the planarization layer 121, is formed. The openings 141a, 141b, and 141c may be the first opening 141a for exposing the first electrode 130 of the first pixel P1, the second opening 141b for exposing the first electrode 130 of the second pixel P2, and the third opening 141c for exposing the first electrode 130 of the third pixel P3. Because the first opening 141a, the second opening 141b, and the third opening 141c have been described, the duplicate explanation thereof will be omitted. The pixel defining layer 140 that includes the first opening 141a, the second opening 141b, and the third opening 141c may be formed by depositing an insulating material on the whole surface of the planarization layer 121 to cover the first electrode 130 and patterning the deposited insulating material.

Figure 12:
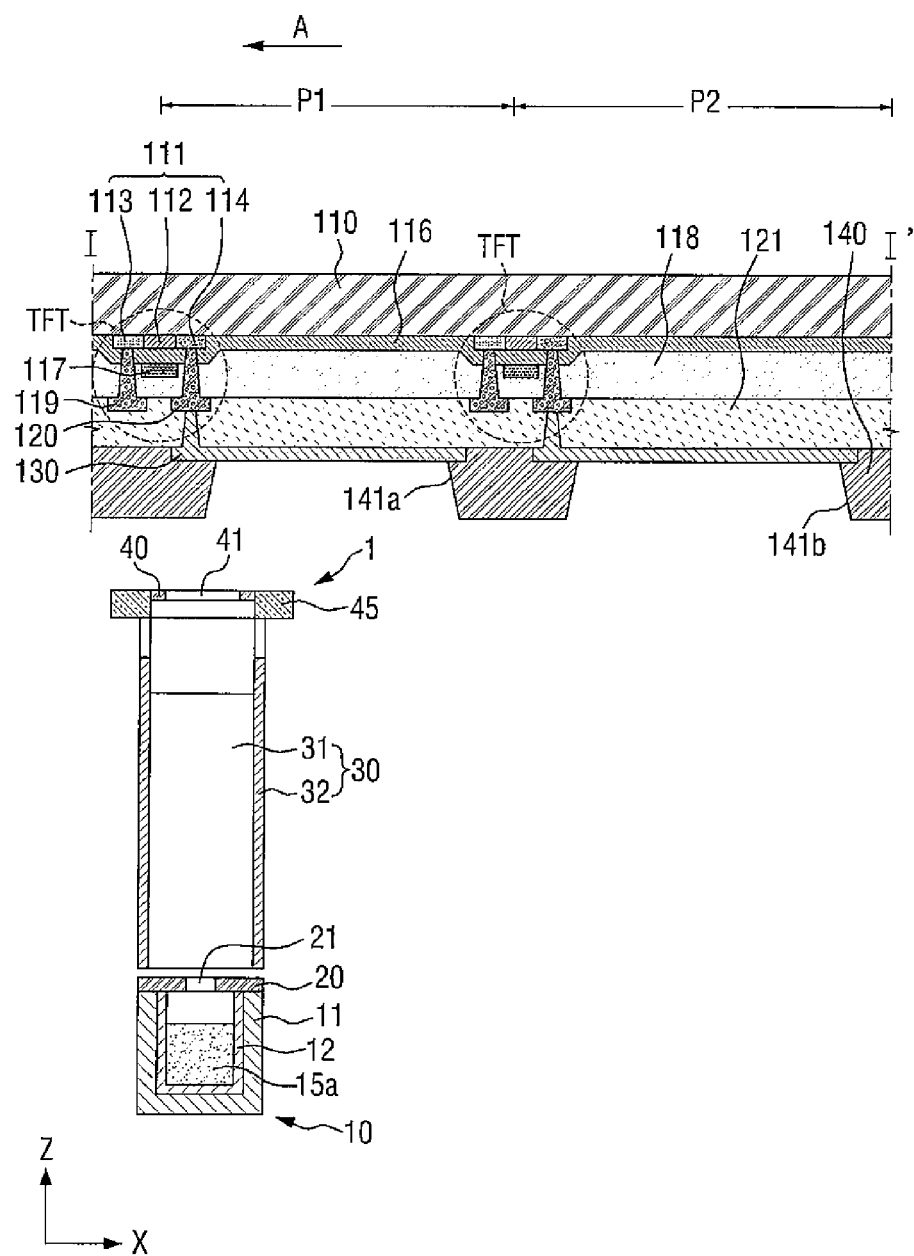
Figure 13:
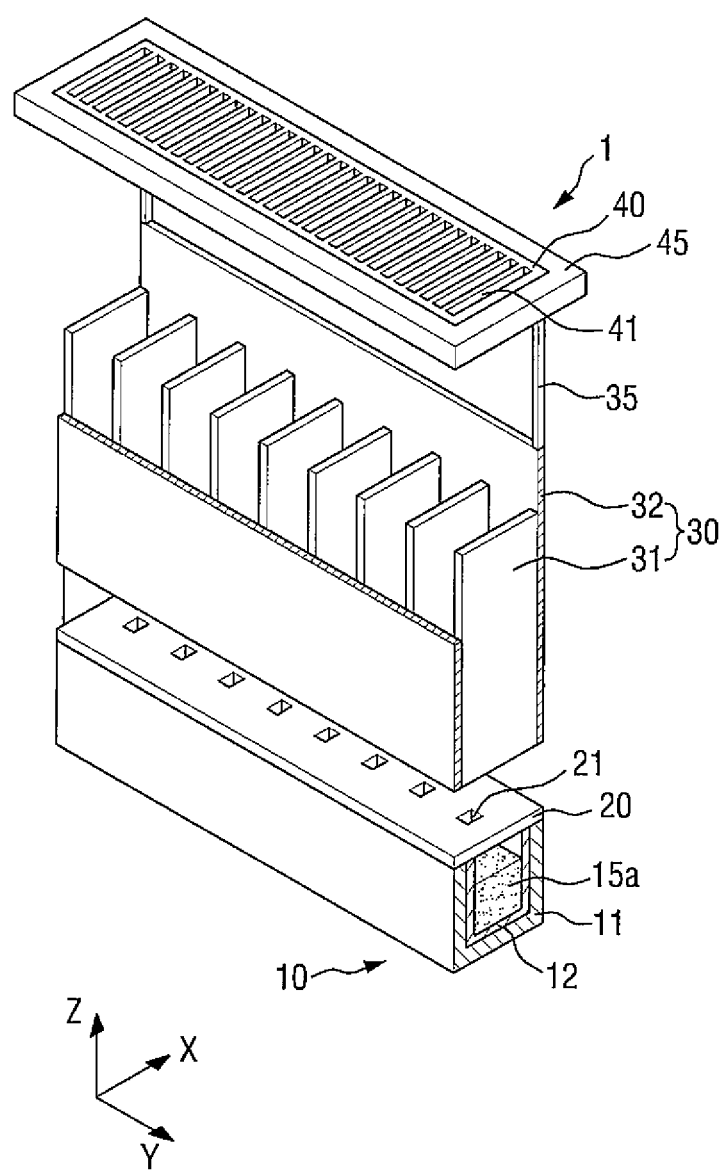
Figure 14:
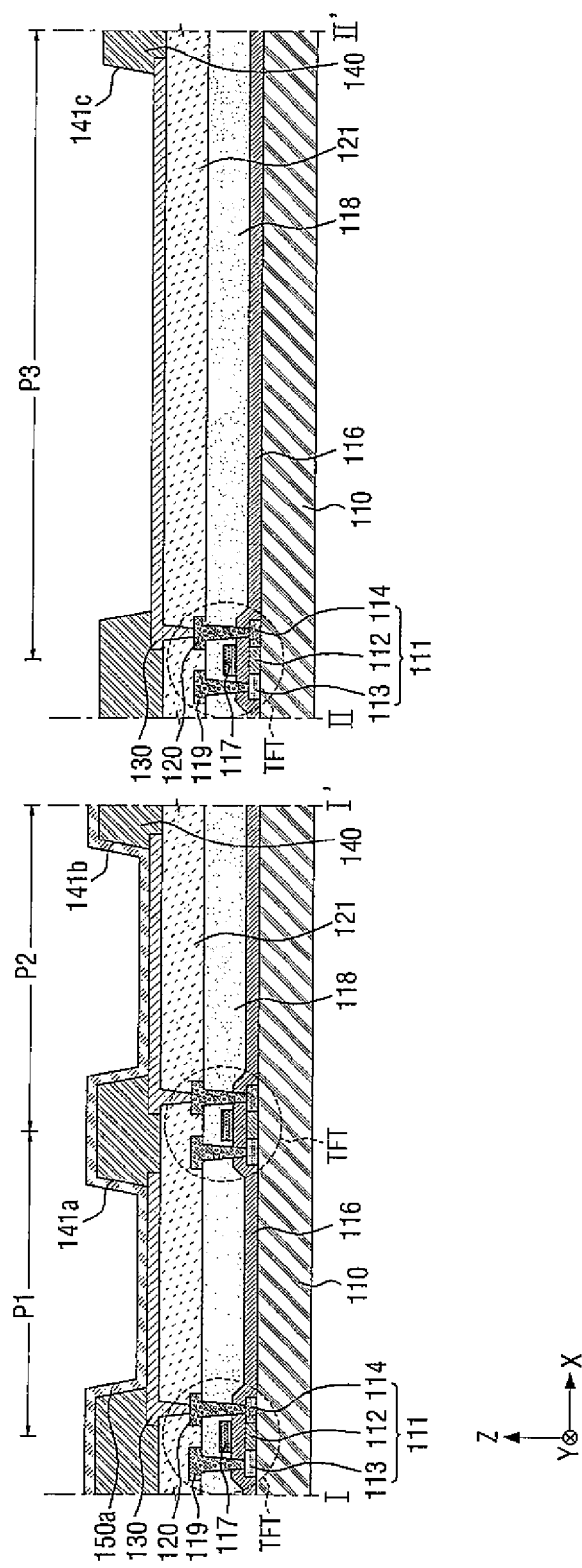

Then, referring to FIGS. 12 to 14, first light emitting layers 150a are consecutively formed on the first electrodes 130 of the first pixel P1 and the second pixel P2 of the unit pixels UP (e.g., as shown in FIG. 1) arranged in the same row line.

For example, as illustrated in FIGS. 12 and 13, the first substrate 110 is arranged on an upper portion of a deposition device 1 so that the pixel defining layer 140 faces a mask 40 of the deposition device 1 that is used in a small mask scanning (SMS) deposition method. Then, a light emitting material 15a that is provided from the deposition device 1 is deposited on the first electrodes 130 of the first pixel P1 and the second pixel P2 of the unit pixels UP (e.g., as shown in FIG. 1) arranged in the same row line while the deposition device 1 and the first substrate 110 move relatively to each other. Accordingly, as illustrated in FIG. 14, the first light emitting layers 150a are consecutively formed on the first electrodes 130 of the first pixel P1 and the second pixel P2 of the unit pixels UP arranged in the same row line. That is, the light emitting layers 150a are formed in a stripe shape on the first electrodes 130 of the first pixel P1 and the second pixel P2 of the unit pixels UP (e.g., as shown in FIG. 1) arranged in the same row line on the first substrate 110.

On the other hand, although FIG. 12 illustrates that the first substrate 110 rather than the deposition device 1 is moved in direction A, the deposition device 1 may be moved in an opposite direction to the direction A.

For example, as illustrated in FIG. 13, the light emitting deposition device 1 for depositing a first light emitting material 15a may include a deposition source 10, a deposition source nozzle portion 20, a blocking plate assembly 30, a mask 40, and a mask frame 45. The first light emitting material 15a may be, for example, a yellow light emitting material.

The deposition source 10 includes a furnace 12 that is filled with the first light emitting material 15a, and a cooling block 11 surrounding the crucible 12. The cooling block 11 is to minimize radiation of heat from the crucible 12 to an outside, and may include a heater for heating the crucible 12.

The deposition source nozzle portion 20 is arranged on one side of the deposition source 10, and specifically, on the side that is directed from the deposition source 10 to the first substrate 110. The deposition source nozzle portion 20 includes a plurality of deposition source nozzles 21 that are formed in a column direction Y. The plurality of deposition source nozzles 21 may be arranged at equal intervals. The plurality of deposition source nozzles 21 make the first light emitting material 15a that is evaporated by the deposition source 10 pass through the nozzles 21 to be directed in the direction of the first substrate 110.

The blocking plate assembly 30 is arranged on one side of the deposition source nozzle portion 20. The blocking plate assembly 30 includes a plurality of blocking plates 31, and a blocking plate frame 32 arranged on the outside of the plurality of blocking plates 31. The plurality of blocking plates 31 may be arranged in line along the column direction Y. The plurality of blocking plates 31 may be arranged at equal intervals. The respective blocking plates 31 may be formed to extend along Z direction, and may be arranged between the adjacent deposition source nozzles 21. The plurality of blocking plates 31 partition a space between the deposition source nozzle portion 20 and the mask 40 into a plurality of deposition spaces.

Because the blocking plates 31 partition the space between the deposition source nozzle portion 20 and the mask 40 into the plurality of deposition spaces, the first light emitting material 15a that is discharged from one deposition source nozzle 21 is not mixed with the first light emitting material 15a that is discharged from another deposition source nozzle 21, but is deposited on the first substrate 110 through slits 41 of the mask 40. That is, the plurality of blocking plates 31 may serve to guide a movement path of the first light emitting material 15a so that the first light emitting material 15a that is discharged through the respective deposition source nozzles 21 is not dispersed in the column direction Y.

The blocking plate frame 32 may be arranged on side surfaces of the plurality of blocking plates 31 to guide the movement path of the first light emitting material 15a so that the first light emitting material 15a that is discharged through the respective deposition source nozzles 21 is not dispersed in the row direction X.

The mask 40 and the mask frame 45 are arranged between the deposition source 10 and the first substrate 110. The mask frame 45 may be formed in the form of a rectangular frame, and the mask 40 may be coupled to the inside of the mask frame 45. The mask 40 may include a plurality of slits 41 that are arranged along the column direction Y. Each of the slits 41 may extend along the row direction X. The plurality of slits 41 makes the first light emitting material 15a that has passed through the deposition source nozzles 21 to be directed in the direction of the first substrate 110. Here, the number of slits 41 may correspond to the number of first light emitting layers 150a to be formed on the first substrate 110.

The mask 40 may be arranged to be spaced apart from the blocking plate assembly 30, and may be connected to the blocking plate assembly 30 by a separate connection member 35.

Figure 15:
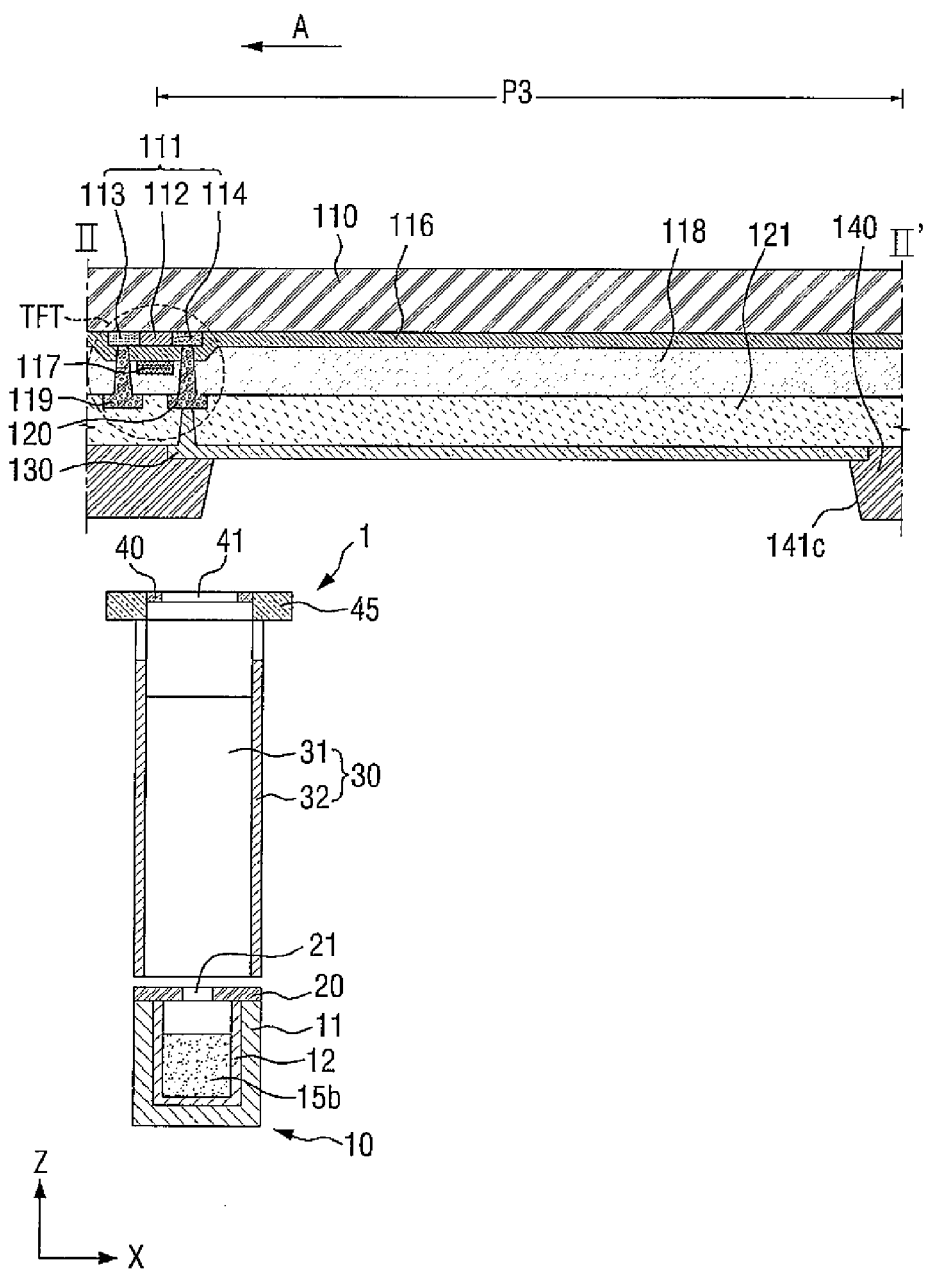
Figure 16:
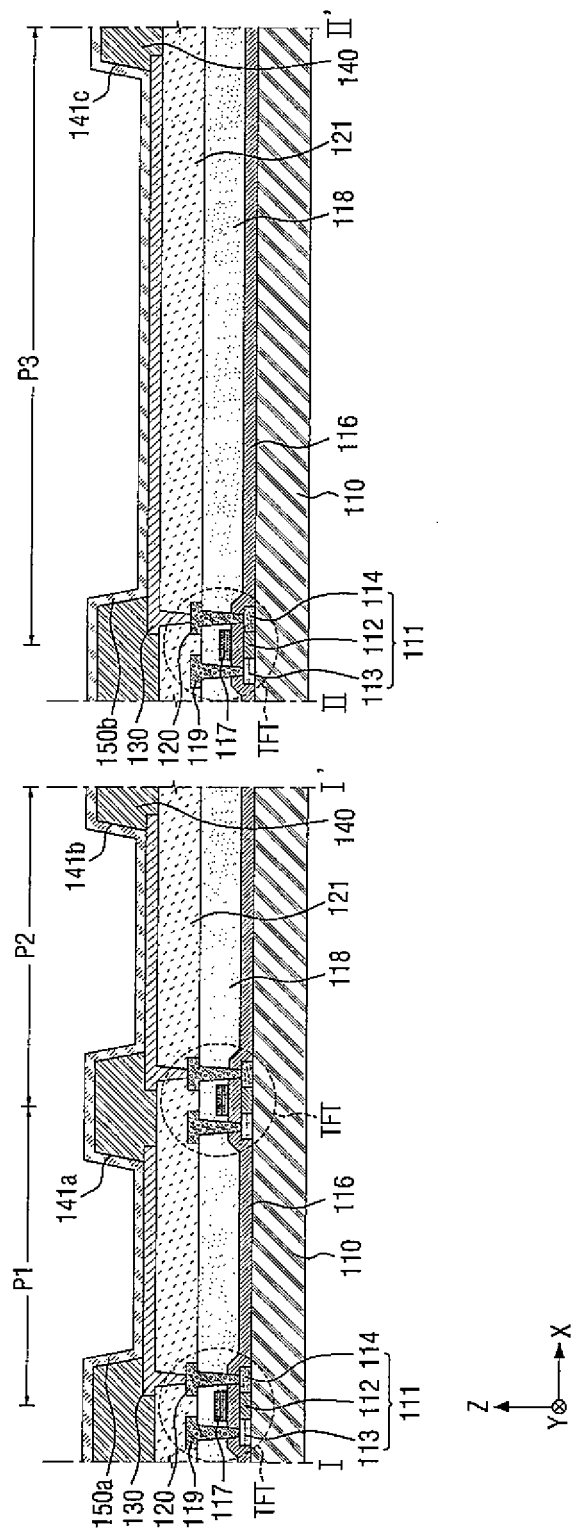

Then, referring to FIGS. 15 and 16, second light emitting layers 150b are consecutively formed on the first electrodes 130 of the third pixel P3 of the unit pixels UP (e.g., as shown in FIG. 1) arranged in the same row line. That is, the second light emitting layers 150b are formed in a stripe shape on the first electrode 130 of the third pixel P3 of the unit pixels UP (e.g., as shown in FIG. 1) arranged in the same row line.

In the same manner as the method for forming the first light emitting layers 150a, the second light emitting layers 150b may be formed using the deposition device 1 that is used in the small mask scanning (SMS) deposition method. However, the crucible 12 of the deposition device 1 is filled with the second light emitting material 15b, and the second light emitting material 15b is deposited on the first electrode 130 of the third pixel P3 of the unit pixels UP (e.g., as shown in FIG. 1) arranged in the same row line of the first substrate 110 to form the second light emitting layers 150b as illustrated in FIG. 16. The second light emitting material 15b may be, for example, a blue light emitting material.

Figure 17:
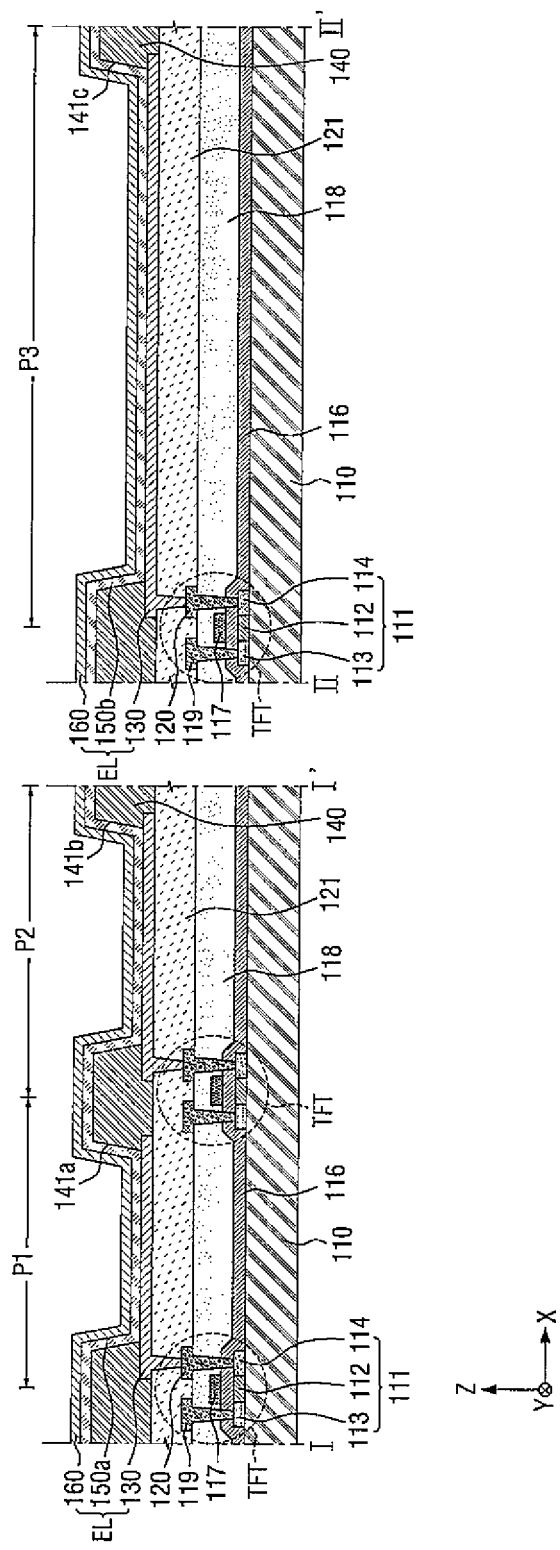

Then, referring to FIG. 17, a second electrode 160 is formed on the first light emitting layer 150a and the second light emitting layer 150b. The second electrode 160 may be formed by depositing a transparent electrode material or a reflective material, for example, a transparent material, on the first light emitting layer 150a and the second light emitting layer 150b and patterning the deposited transparent material.

Figure 18:
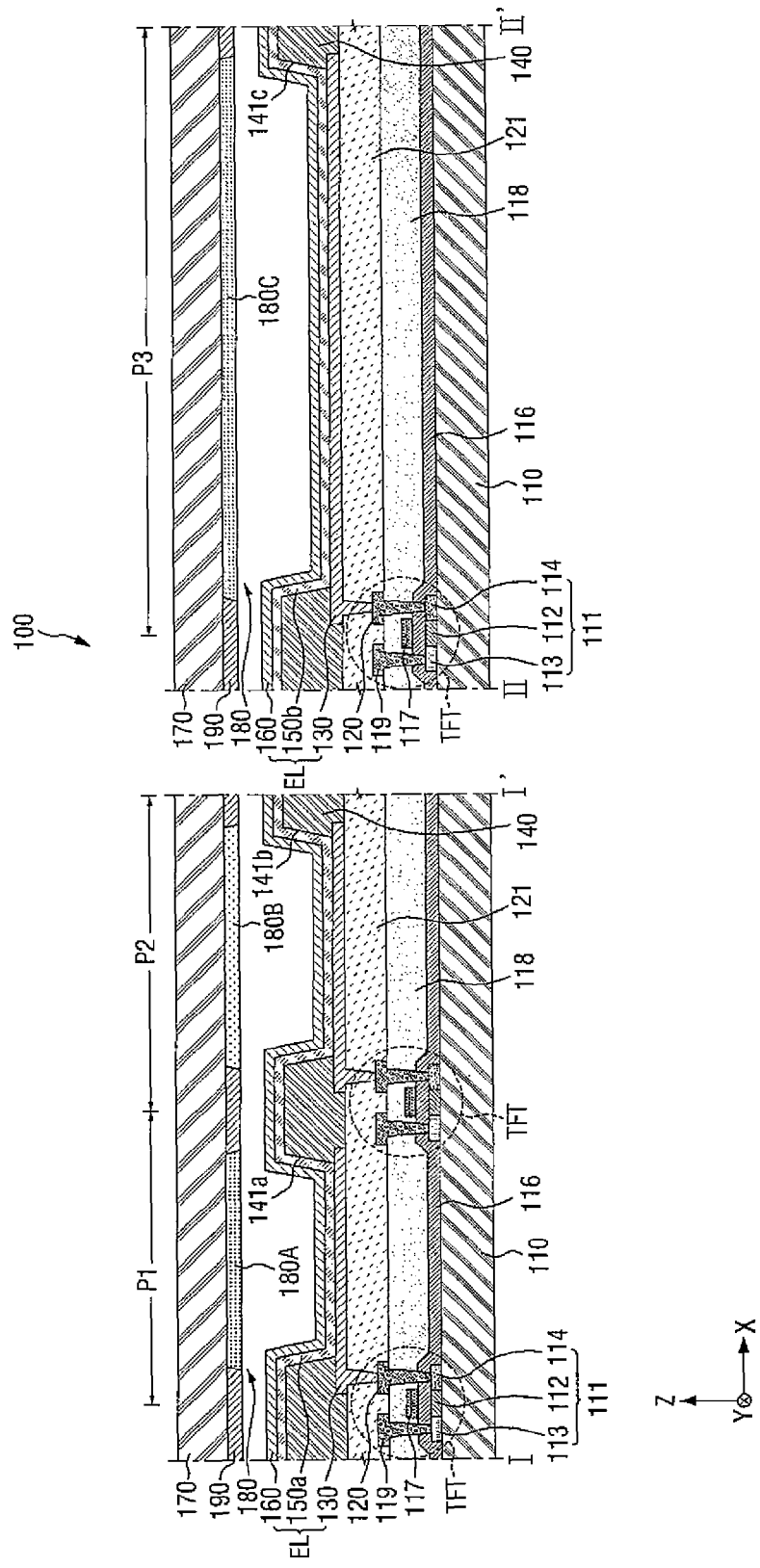

Then, referring to FIG. 18, a second substrate 170 is arranged on an upper portion of the second electrode 160. The second substrate 170 may include a color filter 180 formed for each of the pixels P (e.g., as shown in FIG. 1) and a black matrix 190 arranged between a second color filter 180B and a third color filter 180C. When the second substrate 170 is arranged on the upper portion of the second electrode 160, the color filter 180 may face the second electrode 160.

Figure 19:
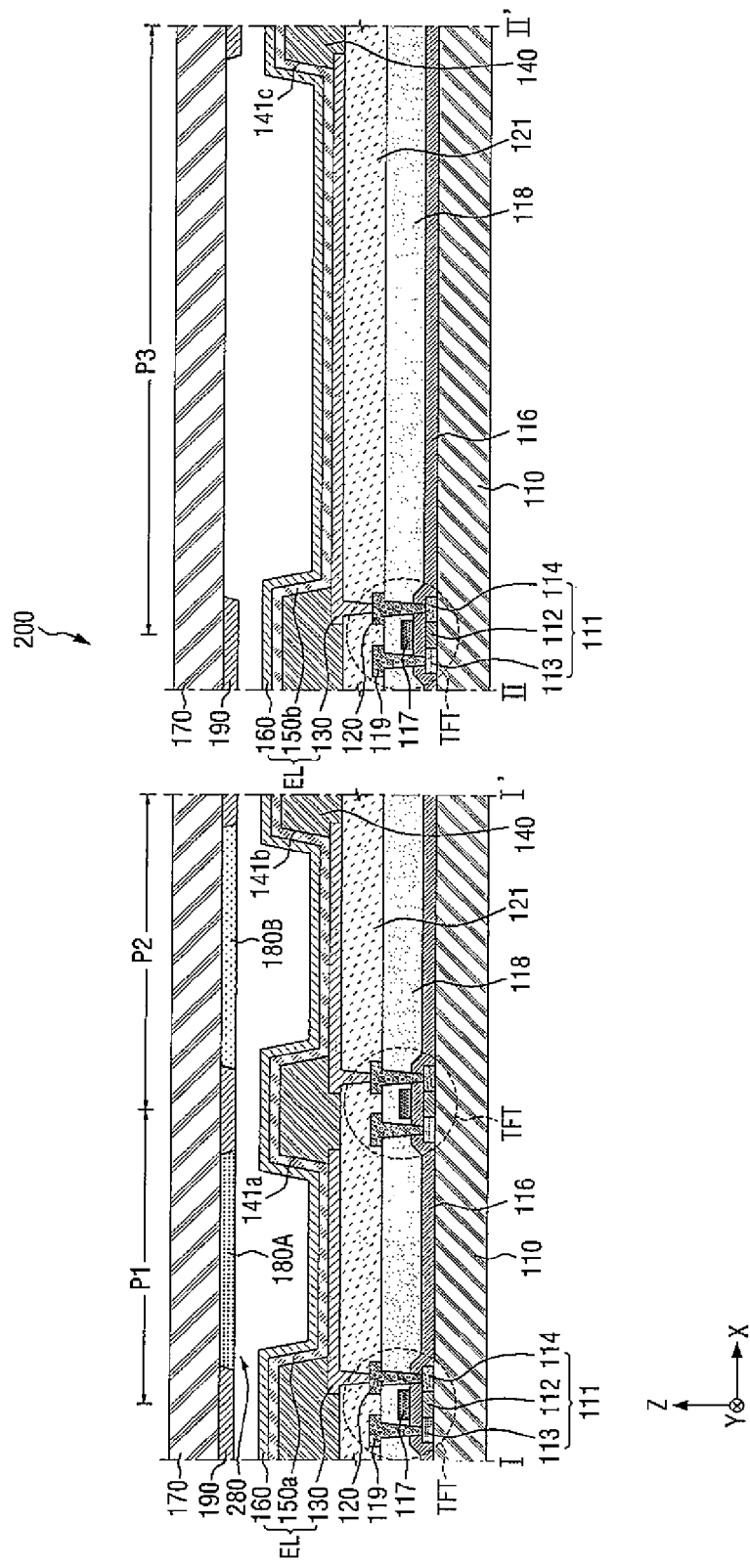
FIG. 19 is a cross-sectional view of a portion that corresponds to portions of FIGS. 4 and 5 in a light emitting display device according to another example embodiment of the present invention.

FIG. 19 is a cross-sectional view of a portion that corresponds to portions of FIGS. 4 and 5 in a light emitting display device according to another embodiment of the present invention.

Referring to FIG. 19, a light emitting display device 200 according to another embodiment of the present invention has the same configuration as the configuration of the light emitting display device 100 of FIGS. 4 and 5 except for a color filter 280. Accordingly, the light emitting display device 200 according to another embodiment of the present invention will be described only around the color filter 280.

The color filter 280 is similar to the color filter 180 of FIGS. 4 and 5. However, the color filter 280 includes the first color filter 180A and the second color filter 180B through omission of the third color filter 180C from the color filter 180. This is because light that is discharged from the second light emitting layer 150b, for example, blue light, is discharged as it is in the direction of the second substrate 170. In this case, a process of forming the color filter 280 can be simplified.

As described above, since the light emitting display device 200 according to another embodiment of the present invention includes the first light emitting layers 150a which are consecutively formed on the first electrodes 130 of the first pixels P1 and the second pixels P2 that emit different colors in the unit pixels UP arranged in the same row line, the first color filters 180A, which convert the light emitted from the first light emitting layer 150a of the first pixel P1 into the first color light to emit the first color light, and the second color filters 180B which convert the light emitted from the first light emitting layer 150a of the second pixel P2 into the second color light to emit the second color light, the gap distance between the first pixel P1 and the second pixel P2 that emit different color lights among the unit pixels UP arranged in the same row line can be reduced, and thus the aperture ratio of the first pixel P1 and the second pixel P2 can be increased.

Accordingly, the whole pixel aperture ratio of the light emitting display device 200 can be increased.

Additionally, a method for manufacturing a light emitting display device 200 according to another embodiment of the present invention is similar to the method for manufacturing a light emitting display device 100 as described above with reference to FIGS. 8 to 18. However, the method according to another embodiment of the present invention is different from the method according to an embodiment of the present invention on the point that the second substrate 170 that is arranged on the upper portion of the second electrode 160 includes the color filter 280 that includes only the first color filter 180A and the second color filter 180B.

Figure 20:
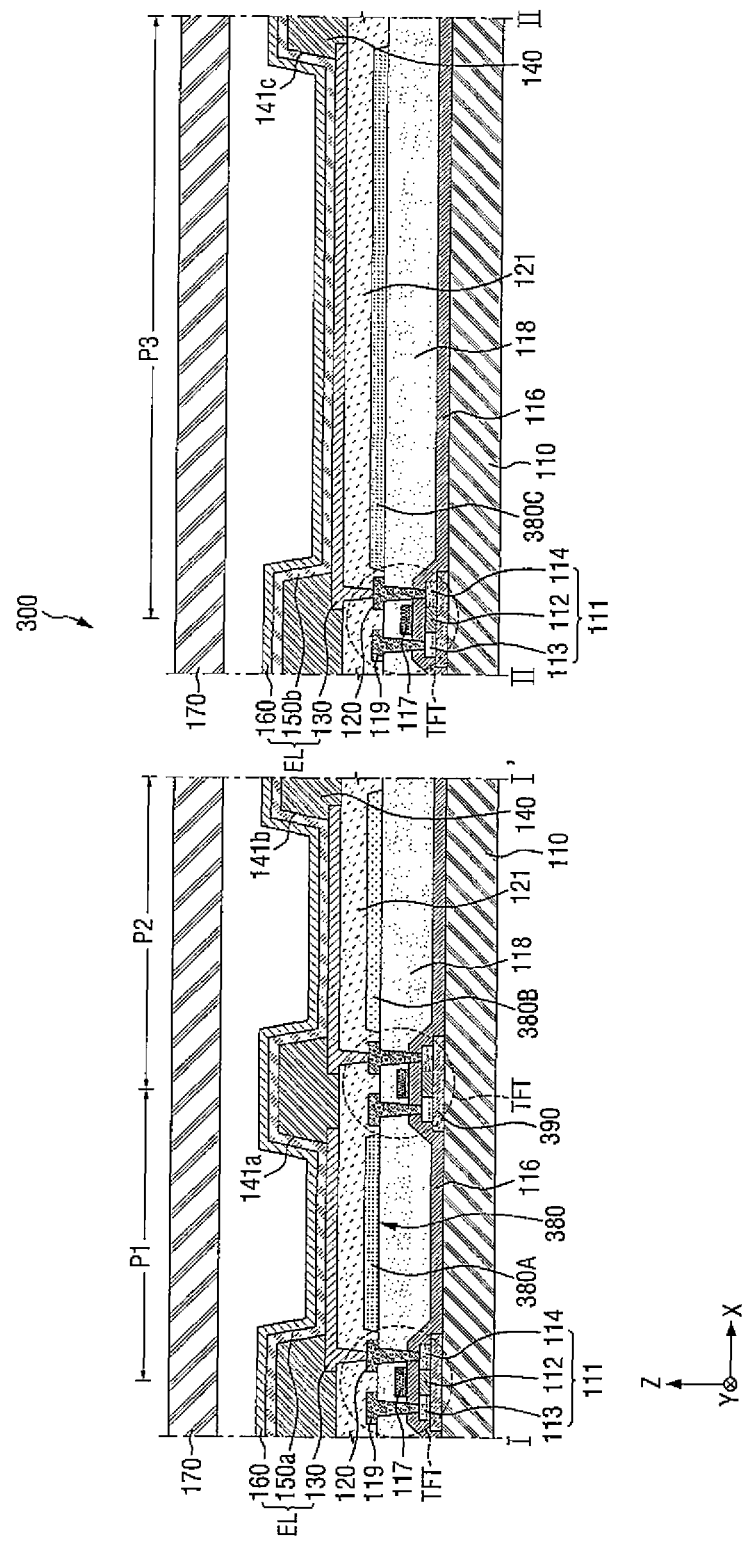
FIG. 20 is a cross-sectional view of a portion that corresponds to portions of FIGS. 4 and 5 in a light emitting display device according to still another example embodiment of the present invention.

FIG. 20 is a cross-sectional view of a portion that corresponds to portions of FIGS. 4 and 5 in a light emitting display device according to still another embodiment of the present invention.

Referring to FIG. 20, a light emitting a light emitting display device 300 according to still another embodiment of the present invention has the same configuration as the configuration of the light emitting display device 100 of FIGS. 4 and 5 except for a color filter 380 and the arrangement position of a black matrix 390. Accordingly, the light emitting display device 300 according to still another embodiment of the present invention will be described only around the color filter 380 and the black matrix 390.

The light emitting display device 300 may include a substrate 110, an active layer 111, a gate insulating layer 116, a gate electrode 117, an interlayer insulating layer 118, a source electrode 119, a drain electrode 120, a planarization layer 121, a first electrode 130, a pixel defining layer 140, a first light emitting layer 150a, a second light emitting layer 150b, a second electrode 160, a second substrate 170, a color filter 380, and a black matrix 390. The respective members may be laminated in Z direction as illustrated in FIG. 20. The light emitting display device 300 may be implemented by a bottom emission light emitting display device, in which light generated from the first light emitting layer 150a and the second light emitting layer 150b is emitted to the bottom of the first substrate 110, e.g., in the direction of the first substrate 110.

The color filter 380 includes a first color filter 380A, a second color filter 380B, and a third color filter 380C, and is similar to the color filter 180 of FIGS. 4 and 5. However, the color filter 380 may be formed for each of pixels P (e.g., as shown in FIG. 1) between the first substrate 110 and the first electrode 130, for example, between the interlayer insulating layer 118 and the planarization layer 121. The first color filter 380A may be arranged on an area that overlaps the first opening 141a on the first pixel P1, the second color filter 380B may be arranged on an area that overlaps the second opening 141b of the second pixel P2, and the third color filter 380C may be arranged on an area that overlaps the third opening 141c of the third pixel P3.

The first color filter 380A may be a filter which filters the light that is discharged to the first light emitting layer 150a of the first pixel P1, for example, yellow light, and emits a first color light, for example, red light, in the direction of the first substrate 110.

The second color filter 380B may be a filter which filters the light that is discharged to the first light emitting layer 150a of the second pixel P2, for example, yellow light, and emits a second color light, for example, green light, in the direction of the first substrate 110.

The third color filter 380C may be a filter which filters the light that is discharged to the second light emitting layer 150b of the third filter P3, for example, blue light, and emits a light having a color purity that is different from the color purity of the light that is discharged from the second light emitting layer 150b in the direction of the first substrate 110.

The black matrix 390 is similar to the black matrix 190 of FIGS. 4 and 5. However, the black matrix 390 may be formed in areas, which do not overlap the first color filter 380A, the second color filter 380B, and the third color filter 380C, between the first substrate 110 and the first electrode 130, for example, between the first substrate 110 and the active layer 111. The black matrix 390 can block color mixing that may appear among the first color filter 380A, the second color filter 380B, and the third color filter 380C due to reflection of the light emitted from the color filter 380 by metal wirings, such as the gate electrode 117, the source electrode 119, and the drain electrode 120.

On the other hand, in the case where the light emitting display device 300 is implemented by a bottom light emitting display device, the first electrode 130 may be used as a transparent electrode, and the second electrode 160 may be used as a reflective electrode.

As described above, because the light emitting display device 300 according to still another embodiment of the present invention includes the first light emitting layers 150a which are consecutively formed on the first electrodes 130 of the first pixels P1 and the second pixels P2 that emit different colors in the unit pixels UP arranged in the same row line, the first color filters 380A which convert the light discharged from the first light emitting layer 150a of the first pixel P1 into the first color light to emit the first color light, and the second color filters 380B which convert the light discharged from the first light emitting layer 150a of the second pixel P2 into the second color light to emit the second color light, the gap distance between the first pixel P1 and the second pixel P2 that emit different color lights among the unit pixels UP arranged in the same row line can be reduced, and thus the aperture ratio of the first pixel P1 and the second pixel P2 can be increased.

Accordingly, the whole pixel aperture ratio of the light emitting display device 300 can be increased.

On the other hand, a method for manufacturing a light emitting display device 300 according to still another embodiment of the present invention is similar to the method for manufacturing a light emitting display device 100 as described above with reference to FIGS. 8 to 18. However, the method according to still another embodiment of the present invention is different from the method according to an embodiment of the present invention on the point that the color filter 380 is arranged between the first substrate 110 and the first electrode 130, and the black matrix 390 is formed between the first substrate 110 and the active layer 112.

In concluding the detailed description, those skilled in the art will appreciate that many variations and modifications can be made to the example embodiments without substantially departing from the principles of the present invention. Therefore, the disclosed example embodiments of the invention are used in a generic and descriptive sense only and not for purposes of limitation. Instead, it should be understood that various changes and modifications can be made by one having ordinary skill in the art within the spirit and scope of the present invention as defined in the following claims, and their equivalents.

What is claimed is:

1. A light emitting display device, comprising:
a first substrate;
a plurality of pixels arranged on the first substrate in a matrix and divided into a plurality of unit pixels arranged in a row direction and in a column direction, each of the unit pixels comprising a first pixel and a second pixel arranged along the row direction, and a third pixel arranged in the column direction with respect to the first pixel and the second pixel;

a first electrode corresponding to each of the respective pixels and;

a pixel defining layer partitioning the respective pixels on the first substrate and having a gap distance between a third opening exposing the first electrode of the third pixel and a second opening exposing the first electrode of the second pixel that is longer than a gap distance between a first opening exposing the first electrode of the first pixel and the second opening;

first light emitting layers consecutively disposed on the first electrode of the first pixel and the second pixel of the unit pixels in the same row line;

second light emitting layers consecutively disposed on the first electrode of the third pixel of the unit pixels in the same row line; and a second electrode disposed on the first light emitting layer and the second light emitting layer.

2. The light emitting display device of claim 1, wherein the first light emitting layers are disposed on both an upper surface of the pixel defining layer between the first pixel and the second pixel of the unit pixels in the same row line and an upper surface of the pixel defining layer between the unit pixels, and have a stripe shape.

3. The light emitting display device of claim 1, wherein the first light emitting layers and the second light emitting layers alternate in the column direction.

4. The light emitting display device of claim 1, wherein the first light emitting layers or the second light emitting layers face each other between adjacent unit pixels in the column direction.

5. The light emitting display device of claim 1, wherein the first light emitting layer is a yellow light emitting layer configured to emit yellow light, and the second light emitting layer is a blue light emitting layer configured to emit blue light.

6. The light emitting display device of claim 1, further comprising:
    a second substrate disposed on the second electrode; and
    a color filter disposed on the second substrate,
wherein the color filter comprises:
    a first color filter corresponding to the first pixel and configured to perform filtering of light that is discharged from the first light emitting layer and to emit a first color light in a direction of the second substrate; and
    a second color filter corresponding to the second pixel and configured to perform filtering of the light that is discharged from the first light emitting layer and to emit a second color light that is different from the first color in the direction of the second substrate.

7. The light emitting display device of claim 6, wherein the first color is red, and the second color is green.

8. The light emitting display device of claim 6, wherein the color filter further comprises a third color filter corresponding to the third pixel and configured to perform filtering of light that is discharged from the second light emitting layer and to emit a light having a color purity that is different from a color purity of the light that is discharged from the second light emitting layer in the direction of the second substrate.

9. The light emitting display device of claim 1, further comprising:
    a second substrate disposed on the second electrode; and
    a color filter disposed between the first substrate and the first electrode,
wherein the color filter comprises:
    a first color filter corresponding to the first pixel and configured to perform filtering of light that is discharged from the first light emitting layer and to emit a first color light in a direction of the first substrate; and
    a second color filter corresponding to the second pixel and configured to perform filtering of the light that is discharged from the first light emitting layer and to emit a second color light that is different from the first color in the direction of the first substrate.

10. The light emitting display device of claim 1, wherein the first pixels or the second pixels face each other between adjacent unit pixels among the unit pixels in the same row line.

* * * * *